(12) United States Patent
Wu et al.

(10) Patent No.: US 12,212,413 B2
(45) Date of Patent: Jan. 28, 2025

(54) TECHNIQUES FOR GENERATING AND USING LONGER LOW-DENSITY PARITY CHECK CODEWORDS

(71) Applicant: QUALCOMM Incorporated, San Diego, CA (US)

(72) Inventors: Kanke Wu, San Diego, CA (US); Bin Tian, San Diego, CA (US); Lin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 18/145,844

(22) Filed: Dec. 22, 2022

(65) Prior Publication Data

US 2024/0223308 A1 Jul. 4, 2024

(51) Int. Cl.
*H04L 1/00* (2006.01)
*H03M 13/11* (2006.01)

(52) U.S. Cl.
CPC ....... *H04L 1/0063* (2013.01); *H03M 13/1102* (2013.01); *H04L 1/0057* (2013.01)

(58) Field of Classification Search
None
See application file for complete search history.

(56) References Cited

U.S. PATENT DOCUMENTS

| | | | | |
|---|---|---|---|---|
| 6,781,529 B1* | 8/2004 | Lin | .................. | H03M 7/42 341/67 |
| 2007/0101229 A1 | 5/2007 | Niu et al. | | |
| 2007/0143656 A1 | 6/2007 | Niu et al. | | |
| 2010/0146372 A1* | 6/2010 | Tomlinson | .......... | H03M 13/293 714/752 |
| 2011/0302475 A1* | 12/2011 | Eisenhuth | ......... | H03M 13/1515 714/763 |
| 2015/0128013 A1* | 5/2015 | Okamura | ........... | H03M 13/1117 714/776 |
| 2016/0380722 A1* | 12/2016 | Hassanin | .............. | H04L 1/0045 714/776 |
| 2018/0123832 A1 | 5/2018 | Blanksby et al. | | |
| 2020/0153458 A1* | 5/2020 | Strobel | ............. | H03M 13/2906 |

(Continued)

OTHER PUBLICATIONS

Partial International Search Report—PCT/US2023/084358—ISA/EPO—Mar. 12, 2024 (2300266WO).

(Continued)

*Primary Examiner* — Daniel F. McMahon
(74) *Attorney, Agent, or Firm* — Kevin M. Donnelly; Holland & Hart LLP

(57) ABSTRACT

Methods, systems, and devices for wireless communications are described. A first wireless device, such as a wireless station (STA) or a wireless access point (AP), performs a low-density parity check (LDPC) coding operation on input bits of a set of code blocks. Performing the LDPC coding operation on the input bits produces a set of codewords including one or more codewords having a first codeword length and one or more codewords having a second, shorter codeword length. The first wireless device arranges the set of codewords into a set of symbols such that a last symbol in time of the set of symbols includes the one or more codewords each having the second codeword length and no codewords having the first codeword length. The first wireless device, transmits, to a second wireless device, the plurality of symbols.

28 Claims, 13 Drawing Sheets

(56) References Cited

U.S. PATENT DOCUMENTS

2021/0184796 A1* 6/2021 Ibrahim ................ H04L 1/0028
2022/0116139 A1 4/2022 Chen et al.
2024/0048271 A1* 2/2024 Fang .................... H04L 1/0041

OTHER PUBLICATIONS

International Search Report and Written Opinion—PCT/US2023/084358—ISA/EPO—May 7, 2024 (2300266WO).

* cited by examiner

TECHNIQUES FOR GENERATING AND USING LONGER LOW-DENSITY PARITY CHECK CODEWORDS

TECHNICAL FIELD

This disclosure relates to wireless communications, and more specifically, to techniques enabling generation and usage of longer low-density parity check (LDPC) codewords.

DESCRIPTION OF THE RELATED TECHNOLOGY

A wireless local area network (WLAN) may be formed by one or more wireless access points (APs) that provide a shared wireless communication medium for use by multiple client devices also referred to as wireless stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

In some Wi-Fi deployments of a WLAN, an encoding device may perform a low-density parity check (LDPC) coding operation to generate one or more codewords for transmission. In some such deployments, the encoding device may be configured with a fixed set of LDPC codeword lengths and may select a codeword length from the set that is based on or otherwise associated with a quantity of payload bits or a quantity of input bits to be transmitted. In some examples in which the encoding device has a relatively high quantity of payload bits to transmit, the encoding device may generate multiple codewords with a same codeword length. However, the use of a fixed set of LDPC codeword lengths and using the same codeword length for each of the multiple codewords may limit channel gain for LDPC encoding, among other drawbacks.

SUMMARY

The systems, methods and devices of this disclosure each have several innovative aspects, no single one of which is solely responsible for the desirable attributes disclosed herein.

One innovative aspect of the subject matter described in this disclosure can be implemented in a method for wireless communication at a first wireless device. The method may include performing a low-density parity check (LDPC) coding operation on a set of multiple input bits, the performance of the LDPC coding operation on the set of multiple input bits producing a set of multiple output bits arranged in a set of multiple codewords including one or more codewords each having a first codeword length and one or more codewords each having a second codeword length that is shorter than the first codeword length, arranging the set of multiple codewords into a set of multiple symbols such that a last symbol in time of the set of multiple symbols includes at least a portion of the one or more codewords having the second codeword length and no codewords having the first codeword length, and transmitting, to a second wireless device, the set of multiple symbols.

Another innovative aspect of the subject matter described in this disclosure can be implemented in an apparatus for wireless communication at a first wireless device. The apparatus may include a processor and memory coupled with the processor. The memory may store instructions executable by the processor to cause the apparatus to perform an LDPC coding operation on a set of multiple input bits, the performance of the LDPC coding operation on the set of multiple input bits producing a set of multiple output bits arranged in a set of multiple codewords including one or more codewords each having a first codeword length and one or more codewords each having a second codeword length that is shorter than the first codeword length, arrange the set of multiple codewords into a set of multiple symbols such that a last symbol in time of the set of multiple symbols includes at least a portion of the one or more codewords having the second codeword length and no codewords having the first codeword length, and transmit, to a second wireless device, the set of multiple symbols.

Another innovative aspect of the subject matter described in this disclosure can be implemented in an apparatus for wireless communication at a first wireless device. The apparatus may include means for performing an LDPC coding operation on a set of multiple input bits, the performance of the LDPC coding operation on the set of multiple input bits producing a set of multiple output bits arranged in a set of multiple codewords including one or more codewords each having a first codeword length and one or more codewords each having a second codeword length that is shorter than the first codeword length, means for arranging the set of multiple codewords into a set of multiple symbols such that a last symbol in time of the set of multiple symbols includes at least a portion of the one or more codewords having the second codeword length and no codewords having the first codeword length, and means for transmitting, to a second wireless device, the set of multiple symbols.

Another innovative aspect of the subject matter described in this disclosure can be implemented in a non-transitory computer-readable medium storing code for wireless communication at a first wireless device. The code may include instructions executable by a processor to perform an LDPC coding operation on a set of multiple input bits, the performance of the LDPC coding operation on the set of multiple input bits producing a set of multiple output bits arranged in a set of multiple codewords including one or more codewords each having a first codeword length and one or more codewords each having a second codeword length that is shorter than the first codeword length, arrange the set of multiple codewords into a set of multiple symbols such that a last symbol in time of the set of multiple symbols includes at least a portion of the one or more codewords having the second codeword length and no codewords having the first codeword length, and transmit, to a second wireless device, the set of multiple symbols.

Another innovative aspect of the subject matter described in this disclosure can be implemented in a method for wireless communication at a first wireless device. The method may include performing an LDPC coding operation on a set of multiple input bits, the performance of the LDPC coding operation on the set of multiple input bits producing a set of multiple output bits arranged in one or more codewords having a codeword length that is associated with a size of a resource unit satisfying a first threshold, a modulation and coding scheme index for the LDPC coding operation satisfying a second threshold, a quantity of coded bits per symbol satisfying a third threshold, or any combination thereof, arranging the one or more codewords into a set of multiple symbols including one or more padded symbols after a forward error correction, and transmitting, to a second wireless device via the resource unit, the set of multiple symbols with a header indicating a quantity of the one or more padded symbols.

Another innovative aspect of the subject matter described in this disclosure can be implemented in an apparatus for wireless communication at a first wireless device. The apparatus may include a processor and memory coupled with the processor. The memory may store instructions executable by the processor to cause the apparatus to perform an LDPC coding operation on a set of multiple input bits, the performance of the LDPC coding operation on the set of multiple input bits producing a set of multiple output bits arranged in one or more codewords having a codeword length that is associated with a size of a resource unit satisfying a first threshold, a modulation and coding scheme index for the LDPC coding operation satisfying a second threshold, a quantity of coded bits per symbol satisfying a third threshold, or any combination thereof, arrange the one or more codewords into a set of multiple symbols including one or more padded symbols after a forward error correction, and transmit, to a second wireless device via the resource unit, the set of multiple symbols with a header indicating a quantity of the one or more padded symbols.

Another innovative aspect of the subject matter described in this disclosure can be implemented in an apparatus for wireless communication at a first wireless device. The apparatus may include means for performing an LDPC coding operation on a set of multiple input bits, the performance of the LDPC coding operation on the set of multiple input bits producing a set of multiple output bits arranged in one or more codewords having a codeword length that is associated with a size of a resource unit satisfying a first threshold, a modulation and coding scheme index for the LDPC coding operation satisfying a second threshold, a quantity of coded bits per symbol satisfying a third threshold, or any combination thereof, means for arranging the one or more codewords into a set of multiple symbols including one or more padded symbols after a forward error correction, and means for transmitting, to a second wireless device via the resource unit, the set of multiple symbols with a header indicating a quantity of the one or more padded symbols.

Another innovative aspect of the subject matter described in this disclosure can be implemented in a non-transitory computer-readable medium storing code for wireless communication at a first wireless device. The code may include instructions executable by a processor to perform an LDPC coding operation on a set of multiple input bits, the performance of the LDPC coding operation on the set of multiple input bits producing a set of multiple output bits arranged in one or more codewords having a codeword length that is associated with a size of a resource unit satisfying a first threshold, a modulation and coding scheme index for the LDPC coding operation satisfying a second threshold, a quantity of coded bits per symbol satisfying a third threshold, or any combination thereof, arrange the one or more codewords into a set of multiple symbols including one or more padded symbols after a forward error correction, and transmit, to a second wireless device via the resource unit, the set of multiple symbols with a header indicating a quantity of the one or more padded symbols.

Another innovative aspect of the subject matter described in this disclosure can be implemented in a method for wireless communication at a second wireless device. The method may include receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length and decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Another innovative aspect of the subject matter described in this disclosure can be implemented in an apparatus for wireless communication at a second wireless device. The apparatus may include a processor and memory coupled with the processor. The memory may store instructions executable by the processor to cause the apparatus to receive, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length and decode, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Another innovative aspect of the subject matter described in this disclosure can be implemented in an apparatus for wireless communication at a second wireless device. The apparatus may include means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length and means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Another innovative aspect of the subject matter described in this disclosure can be implemented in a non-transitory computer-readable medium storing code for wireless communication at a second wireless device. The code may include instructions executable by a processor to receive, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length and decode, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Another innovative aspect of the subject matter described in this disclosure can be implemented in a method for wireless communication at a second wireless device. The method may include receiving, from a first wireless device, a set of multiple symbols with a header indicating a quantity of one or more padded symbols included after a forward error correction and decoding the set of multiple symbols including one or more codewords encoded using an LDPC coding operation and the quantity of the one or more padded symbols, a codeword length of the one or more codewords associated with a size of a resource unit satisfying a first threshold, a modulation and coding scheme index for the LDPC coding operation satisfying a second threshold, a quantity of coded bits per symbol of the set of multiple symbols satisfying a third threshold, or any combination thereof.

Another innovative aspect of the subject matter described in this disclosure can be implemented in an apparatus for wireless communication at a second wireless device. The apparatus may include a processor and memory coupled with the processor. The memory may store instructions executable by the processor to cause the apparatus to receive, from a first wireless device, a set of multiple symbols with a header indicating a quantity of one or more padded symbols included after a forward error correction and decode the set of multiple symbols including one or more codewords encoded using an LDPC coding operation and the quantity of the one or more padded symbols, a codeword length of the one or more codewords associated with a size of a resource unit satisfying a first threshold, a modulation and coding scheme index for the LDPC coding operation satisfying a second threshold, a quantity of coded bits per symbol of the set of multiple symbols satisfying a third threshold, or any combination thereof.

Another innovative aspect of the subject matter described in this disclosure can be implemented in an apparatus for wireless communication at a second wireless device. The apparatus may include means for receiving, from a first wireless device, a set of multiple symbols with a header indicating a quantity of one or more padded symbols included after a forward error correction and means for decoding the set of multiple symbols including one or more codewords encoded using an LDPC coding operation and the quantity of the one or more padded symbols, a codeword length of the one or more codewords associated with a size of a resource unit satisfying a first threshold, a modulation and coding scheme index for the LDPC coding operation satisfying a second threshold, a quantity of coded bits per symbol of the set of multiple symbols satisfying a third threshold, or any combination thereof.

Another innovative aspect of the subject matter described in this disclosure can be implemented in a non-transitory computer-readable medium storing code for wireless communication at a second wireless device. The code may include instructions executable by a processor to receive, from a first wireless device, a set of multiple symbols with a header indicating a quantity of one or more padded symbols included after a forward error correction and decode the set of multiple symbols including one or more codewords encoded using an LDPC coding operation and the quantity of the one or more padded symbols, a codeword length of the one or more codewords associated with a size of a resource unit satisfying a first threshold, a modulation and coding scheme index for the LDPC coding operation satisfying a second threshold, a quantity of coded bits per symbol of the set of multiple symbols satisfying a third threshold, or any combination thereof.

BRIEF DESCRIPTION OF THE DRAWINGS

Details of one or more implementations of the subject matter described in this disclosure are set forth in the accompanying drawings and the description below. However, the accompanying drawings illustrate only some typical aspects of this disclosure and are therefore not to be considered limiting of its scope. Other features, aspects, and advantages will become apparent from the description, the drawings and the claims.

Like reference numbers and designations in the various drawings indicate like elements.

DETAILED DESCRIPTION

Figure 1:
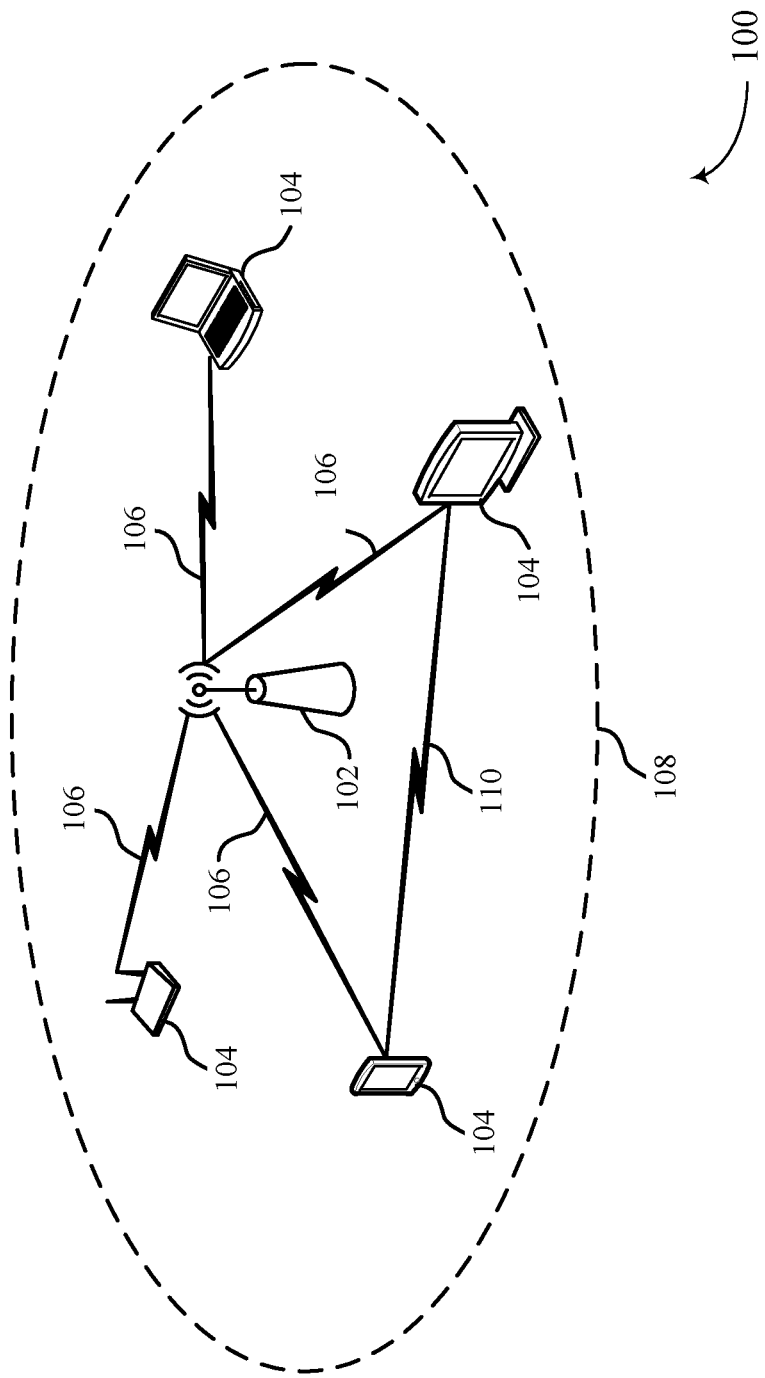
FIG. 1 illustrates an example of a wireless communications system that supports techniques for generating and using longer low-density parity check (LDPC) codewords in accordance with aspects of the present disclosure.

The following description is directed to some particular examples for the purposes of describing innovative aspects of this disclosure. However, a person having ordinary skill in the art will readily recognize that the teachings herein can be applied in a multitude of different ways. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described examples can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), spatial division multiple access (SDMA), rate-splitting multiple access (RSMA), multi-user shared access (MUSA), single-user (SU) multiple-input multiple-output (MIMO) and multi-user (MU)-MIMO. The described examples also can be implemented using other wireless communication protocols or RF signals suitable for use in one or more of a wireless personal area network (WPAN), a wireless local area network (WLAN), a wireless wide area network (WWAN), a wireless metropolitan area network (WMAN), or an internet of things (IOT) network.

Various aspects relate generally to wireless communications and more particularly to low-density parity check (LDPC) coding operations. Some aspects more specifically relate to LDPC coding operations that generate LDPC codewords having longer codeword lengths than those generated by existing LDPC coding operations. An access point (AP) or a wireless station (STA) may perform an LDPC coding operation on a set of input bits to generate output bits arranged into codewords. In some examples, a first wireless device, such as the AP or the STA, may select a longer codeword length based on or otherwise associated with a quantity that is a function of a quantity of input bits, a modulation and coding scheme (MCS) level, or a size of a resource unit (RU), or any combination thereof. The first wireless device may perform the LDPC coding operation to generate one or more codewords each having the longer codeword length. For example, the longer codeword length may be longer than the 1944 bits currently defined for LDPC coding in the IEEE 802.11 family of wireless communication protocol standards. In some examples, the first wireless device may use mixed codeword lengths (for example, use codewords having different lengths), encoding input bits into one or more codewords having a first, longer codeword length and one or more codewords having a second, shorter codeword length. In some examples, a shorter codeword length may be 1944 bits or less than 1944 bits, and a longer codeword length may be more than 1944 bit. The first wireless device may arrange the codewords into a set of symbols such that a last symbol of the set of symbols includes at least a portion of the one or more codewords having the shorter codeword length, and the first wireless device may transmit the set of symbols to the second wireless device. In some examples in which the first wireless device produces codewords having mixed codeword lengths, the first wireless device may perform shortening or puncturing on the codewords having the longer codeword length, or on the codewords having the shorter codeword length, or both. For example, the encoding device may distribute shortening bits and puncturing bits among all codewords proportional to the respective codeword lengths. For example, the encoding device may puncture a same percentage of each codeword or include shortening bits in each codeword such that approximately the same percentage of each codeword is shortening bits. In some other examples, the encoding device may perform the shortening and the puncturing on only codewords having the shorter codeword length and not on codewords having the longer codeword length. In some examples, the encoding device may use a same code rate for codewords having the shorter codeword length and codewords having the longer codeword length. In some other examples, the encoding device may use different code rates for codewords having different lengths, such as using a lower code rate for codewords having the shorter codeword length.

Particular aspects of the subject matter described in this disclosure may be implemented to realize one or more of the following potential advantages. The techniques employed by the described communication devices can increase performance in examples using LDPC encoding techniques. For example, using longer LDPC codewords can provide lower block error rates in channels, such as channels associated with additive white Gaussian noise (AWGN). The longer LDPC codewords may provide for more reliable communications in channels with a lower signal-to-noise ratio (SNR) than achievable with codeword lengths currently defined in the 802.11 family of wireless communications protocol standards. For example, the encoding device may select a more tailored and/or efficient LDPC codeword length for an LDPC codeword. In some examples, the longer LDPC codewords may provide the lower block error rate due to being more robust than shorter LDPC codewords. Additionally, some techniques may improve LDPC encoding performance by mitigating a puncturing of LDPC codewords, which may result in fewer decoding failures, among other advantages.

Aspects of the disclosure are initially described in the context of a wireless communications system. Aspects of the disclosure are further illustrated by and described with reference to an additional wireless communications system, process flow diagrams, apparatus diagrams, system diagrams, and flowcharts that relate to techniques for generating and using longer LDPC codewords.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2020 specification or amendments thereof including, but not limited to, 802.11ay, 802.11ax, 802.11az, 802.11ba, 802.11bd, 802.11be, 802.11bf, and the 802.11 amendment associated with Wi-Fi 8). The WLAN 100 may include numerous wireless communication devices such as a wireless AP 102 and multiple wireless STAs 104. While only one AP 102 is shown in FIG. 1, the WLAN network 100 also can include multiple APs 102. AP 102 shown in FIG. 1 can represent various different types of APs including but not limited to enterprise-level APs, single-frequency APs, dual-band APs, standalone APs, software-enabled APs (soft APs), and multi-link APs. The coverage area and capacity of a cellular network (such as LTE, 5G NR, etc.) can be further improved by a small cell which is supported by an AP serving as a miniature base station. Furthermore, private cellular networks also can be set up through a wireless area network using small cells.

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, personal digital assistant (PDAs), other handheld devices, netbooks, notebook computers, tablet computers, laptops, chromebooks, extended reality (XR)

headsets, wearable devices, display devices (for example, TVs (including smart TVs), computer monitors, navigation systems, among others), music or other audio or stereo devices, remote control devices ("remotes"), printers, kitchen appliances (including smart refrigerators) or other household appliances, key fobs (for example, for passive keyless entry and start (PKES) systems), Internet of Things (IOT) devices, and vehicles, among other examples. The various STAs 104 in the network are able to communicate with one another via the AP 102.

A single AP 102 and an associated set of STAs 104 may be referred to as a basic service set (BSS), which is managed by the respective AP 102. FIG. 1 additionally shows an example coverage area 108 of the AP 102, which may represent a basic service area (BSA) of the WLAN 100. The BSS may be identified or indicated to users by a service set identifier (SSID), as well as to other devices by a basic service set identifier (BSSID), which may be a medium access control (MAC) address of the AP 102. The AP 102 may periodically broadcast beacon frames ("beacons") including the BSSID to enable any STAs 104 within wireless range of the AP 102 to "associate" or re-associate with the AP 102 to establish a respective communication link 106 (hereinafter also referred to as a "Wi-Fi link"), or to maintain a communication link 106, with the AP 102. For example, the beacons can include an identification or indication of a primary channel used by the respective AP 102 as well as a timing synchronization function for establishing or maintaining timing synchronization with the AP 102. The AP 102 may provide access to external networks to various STAs 104 in the WLAN via respective communication links 106.

To establish a communication link 106 with an AP 102, each of the STAs 104 is configured to perform passive or active scanning operations ("scans") on frequency channels in one or more frequency bands (for example, the 2.4 GHz, 5 GHZ, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (μs)). To perform active scanning, a STA 104 generates and sequentially transmits probe requests on each channel to be scanned and listens for probe responses from APs 102. Each STA 104 may identify, determine, ascertain, or select an AP 102 with which to associate in accordance with the scanning information obtained through the passive or active scans, and to perform authentication and association operations to establish a communication link 106 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such examples, while the STAs 104 may be capable of communicating with each other through the AP 102 using communication links 106, STAs 104 also can communicate directly with each other via direct wireless communication links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless communication links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 106) according to one or more of the IEEE 802.11 family of wireless communication protocol standards. These standards define the WLAN radio and baseband protocols for the PHY and MAC layers. The APs 102 and STAs 104 transmit and receive wireless communications (hereinafter also referred to as "Wi-Fi communications" or "wireless packets") to and from one another in the form of PHY protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHZ band, the 5 GHz band, the 60 GHz band, the 3.6 GHz band, and the 900 MHz band. Some examples of the APs 102 and STAs 104 described herein also may communicate in other frequency bands, such as the 5.9 GHZ and the 6 GHz bands, which may support both licensed and unlicensed communications. The APs 102 and STAs 104 also can communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac, 802.11ax and 802.11be standard amendments may be transmitted over the 2.4, 5 GHz or 6 GHZ bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHZ, 80 MHZ, 160 or 320 MHz by bonding together multiple 20 MHz channels.

Each PPDU is a composite structure that includes a PHY preamble and a payload in the form of a PHY service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is associated with the particular IEEE 802.11 protocol to be used to transmit the payload.

The respective devices of the WLAN 100 may support techniques for LDPC coding operations. For example, an encoding device, such as an AP 102 or a STA 104, may perform an LDPC coding operation on a set of input bits. Performing the LDPC coding operation may produce a set of output bits arranged in a set of codewords. The encoding device may arrange the set of codewords into a set of symbols and transmit the set of symbols to a receiving device, which may perform an LDPC decoding operation to recover the original input bits.

Some WLAN systems may support a limited set of codeword lengths. For example, some WLAN systems may support a codeword length of 648 bits, 1296 bits, or 1944 bits. In some cases, an encoding device of these systems may select a length 648 codeword in examples in which only one codeword is to be generated and a length 1296 codeword in examples in which at most two codewords are to be used to transmit payload bits. In some cases, the encoding device of these systems may use a codeword length of 1944 bits when generating one or multiple codewords, generating as many codewords as needed to encode all of the data. In some existing systems, the encoding device may select the longest codeword length with a shortest quantity of shortening bits prior to potential symbol expansion.

In some cases, an encoding device may have a set of payload bits, $N_{pld}$, to transmit to a receiving device. The encoding device may determine $N_{pld}$ based on or otherwise associated with an aggregate MAC protocol data unit (A-MPDU) pre-end-of-frame (EOF) padding (APEP) length (APEP_LENGTH). In some cases, an initial quantity of symbols and a quantity of data bits per symbol may be based on or otherwise associated with $N_{pld}$. The encoding device may determine a quantity of available bits $N_{avbits}$ based on or otherwise associated with the initial quantity of symbols, a last symbol boundary, and the quantity of coded bits per symbol. In some cases, LDPC codeword length selection may be based on or otherwise associated with rules shown by Table 1.

TABLE 1

| Ranges of $N_{avbits}$ (bits) | Number of LDPC Codewords ($N_{CW}$) | LDPC codeword length (bits) |
|---|---|---|
| $N_{avbits} \leq 648$ | 1 | 1296, if $N_{avbits} \geq N_{pld} + 912 \times (1 - R)$ 648, otherwise |
| $648 < N_{avbits} \leq 1296$ | 1 | 1944, if $N_{avbits} \geq N_{pld} + 1464 \times (1 - R)$ 1296, otherwise |
| $1296 < N_{avbits} \leq 1944$ | 1 | 1944 |
| $1944 < N_{avbits} \leq 2592$ | 2 | 1944, if $N_{avbits} \geq N_{pld} + 2916 \times (1 - R)$ 1296, otherwise |
| $2592 < N_{avbits}$ | $\left\lceil \dfrac{N_{pld}}{1944 \cdot R} \right\rceil$ | 1944 |

For some LDPC encoding techniques, pre-forward error correction (FEC) padding may be added to enable the FEC output to fill one of four OFDM symbol segment boundaries in a last symbol with information. For example, a last symbol of a packet may include information bits up to a quarter of an OFDM symbol, half of an OFDM symbol, three quarters of an OFDM symbol, or a complete OFDM symbol. The remaining bits in the last OFDM symbol may be filled by post-FEC padding bits. For example, if the last symbol of the packet includes information bits up to a first quarter of the last symbol, the remaining three quarters of the last symbol may be filled by post-FEC padding bits. For LDPC encoding, an initial value for the OFDM symbol segment boundary of the last symbol, $\alpha_{init}$, may be based on or otherwise associated with $N_{pld}$, an MCS level, and an RU size. For example, if $\alpha$ is set to 1, the encoding device may fill a first quarter of the last OFDM symbol with information bits, and the last three quarters of the last OFDM symbol may include post-FEC padding bits.

In some cases, the encoding device may use or add an extra OFDM symbol segment, such as an additional quarter of the last symbol, to avoid a high percentage of puncturing in a packet. For example, if a quantity of punctured bits exceeds a threshold or condition, the encoding device may use the extra OFDM symbol segment to increase the quantity of available bits and reduce the amount of puncturing. The conditions for over-puncturing the packet may be based on a quantity of punctured bits, $N_{punc}$, a quantity of shortening bits, $N_{shrt}$, the code rate, R, and the LDPC codeword length, $L_{LDPC}$. For example, the encoding device may use the extra OFDM symbol segment if either of Expression (1) or Expression (2) is true to prevent over-puncturing the packet.

$$(N_{punc} > 0.1 \times N_{cw} \times L_{LDPC} \times (1 - R)) \quad (1)$$

$$\text{AND} \left( N_{shrt} < 1.2 \times N_{punc} \times \frac{R}{1-R} \right)$$

$$(N_{punc} > 0.3 \times N_{cw} \times L_{LDPC} \times (1 - R)) \quad (2)$$

Including the extra OFDM symbol segment may change the symbol segment boundary for the last symbol and update value for a. In examples in which an extra OFDM symbol segment is added, $N_{avbits}$ may be updated, and the encoding device may reselect an LDPC codeword length. In some examples, adding the extra OFDM symbol segment may not result in increasing a quantity of OFDM symbols. For example, if the encoding device initially use a first quarter of the last symbol, adding the extra OFDM symbol segment may enable the encoding device to use half of the last symbol, which may not increase the total quantity of symbols used.

The respective devices of the WLAN 100 may support techniques to generate an LDPC codeword having a longer LDPC codeword length. For example, an encoding device may select a codeword length of greater than 1944 bits for an LDPC codeword. Some examples of longer LDPC codewords may, for example, have a codeword length of 7776 bits or 31104 bits. Techniques for selecting codeword length are described herein. In some examples, the encoding device may perform shortening or puncturing that is based on or otherwise associated with the longer codeword length.

In some examples, the encoding device may select a single codeword length for an entire transmission. For example, the encoding device may generate one or more codewords having a longer codeword length, such as 7776 bits or 31104 bits, and the encoding device may transmit a packet including the one or more codewords having the longer codeword length. In some other examples, the encoding device may select multiple codeword lengths and transmit a packet including codewords having mixed codeword lengths. For example, the encoding device may transmit a packet including one or more codewords having a first, longer codeword length and including one or more codewords having a second, shorter codeword length. Techniques for performing puncturing and shortening associated with the mixed codeword lengths are described herein.

Figure 2:
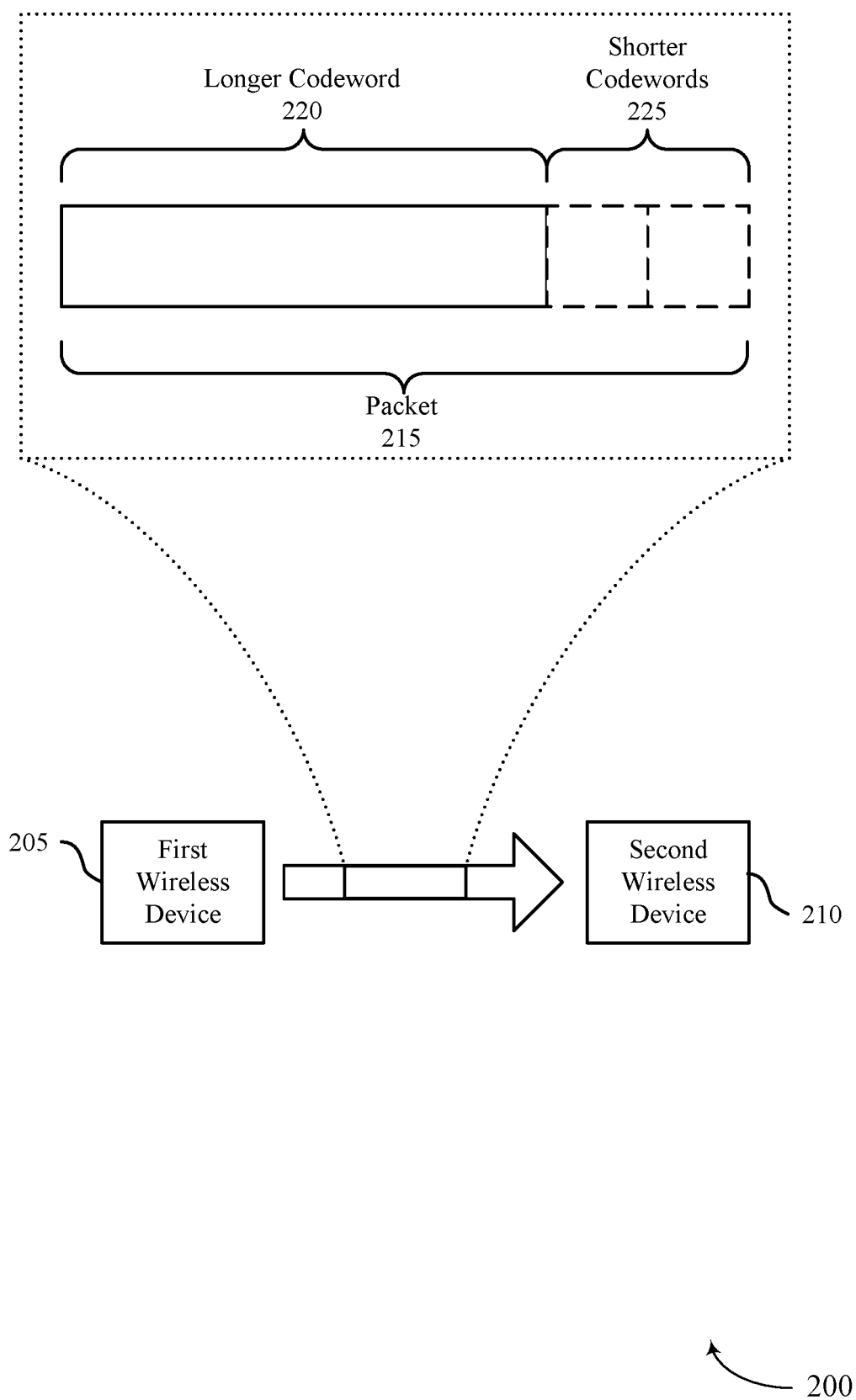
FIG. 2 illustrates an example of a wireless communications system that supports techniques for generating and using longer LDPC codewords in accordance with one or more aspects of the present disclosure.

FIG. 2 illustrates an example of a wireless communications system 200 that supports techniques for generating and using longer LDPC codewords in accordance with one or more aspects of the present disclosure. Aspects of the wireless communications system 200 may implement, or be implemented by, aspects of the WLAN 100. For example, the wireless communications system 200 illustrates communications between a first wireless device 205 and a second wireless device 210, which may each be an example of an AP 102 or a STA 104 as illustrated by described with reference to FIG. 1. In some examples, the first wireless device 205 may be referred to as a transmitting device or an encoding device, and the second wireless device 210 may be referred to as a receiving device or a decoding device.

The first wireless device 205 may transmit, to the second wireless device 210, a packet 215 including one or more codewords arranged into symbols, such as OFDM symbols. For example, the first wireless device 205 may have information bits or payload bits to transmit to the second wireless device 210. The first wireless device 205 may perform an LDPC coding operation on a set of input bits. The performance of the LDPC coding operation may produce output bits arranged in a set of codewords. The first wireless device 205 may arrange the set of codewords into a set of symbols and transmit the packet 215 including the set of symbols to the second wireless device 210.

In some examples, the packet 215 may include one or more codewords each having a same codeword length. For example, the packet 215 may include one or more longer codewords 220. In some cases, a codeword length of a longer codeword may be greater than 1944 bits, such as 7776 bits (four times 1944 bits) or 31104 bits (16 times 1944 bits). In some examples, the codeword length of the longer codeword may be referred to as a first codeword length, a long codeword length, or a longer codeword length.

In some examples, the first wireless device 205 may select a codeword length for the one or more longer codewords 220 based on, or otherwise in accordance with, a quantity of payload bits, $N_{pld}$. As the quantity of payload bits increases, a quantity of available bits, $N_{avbits}$, may similarly increase as described with reference to FIG. 1. For example, the first wireless device 205 may select the codeword length according to Table 2.

TABLE 2

| Ranges of $N_{avbits}$(bits) | Number of LDPC codewords ($N_{CW}$) | LDPC codeword length (bits) |
|---|---|---|
| $N_{avbits} \leq 648$ | 1 | 1296, if $N_{avbits} \geq N_{pld} + 912 \times (1 - R)$ 648, otherwise |
| $648 < N_{avbits} \leq 1296$ | 1 | 1944, if $N_{avbits} \geq N_{pld} + 1464 \times (1 - R)$ 1296, otherwise |

TABLE 2-continued

| Ranges of $N_{avbits}$(bits) | Number of LDPC codewords ($N_{CW}$) | LDPC codeword length (bits) |
|---|---|---|
| $1296 < N_{avbits} \leq 1944$ | 1 | 1944 |
| $1944 < N_{avbits} \leq 2592$ | 2 | 1944, if $N_{avbits} \geq N_{pld} + 2916 \times (1 - R)$ 1296, otherwise |
| $2592 < N_{avbits} \leq 1944 * 3 (5832)$ | 2-3 | 1944 |
| $5832 < N_{avbits} \leq 1944 * 4 (7776)$ | 1 | 7776 |
| $7776 < N_{avbits} \leq 1944 * 6(11664)$ | 5-6 | 1944 |
| $11664 < N_{avbits} \leq 1944 * 12(23328)$ | 2-3 | 7776 |
| $23328 < N_{avbits} \leq 1944 * 16(31104)$ | 1 | 31104 |
| $31104 < N_{avbits} \leq 1944 * 28(54432)$ | 5-6 | 7776 |
| $54432 < N_{avbits}$ | $\left\lceil \frac{N_{pld}}{31104 \cdot R} \right\rceil$ | 31104 |

For examples in which the quantity of available bits is between 5832 bits and 7776 bits, the first wireless device 205 may select a codeword length of 7776 bits for the one or more longer codewords 220. If the quantity of available bits is between 7776 and 11664, it may be more efficient for the first wireless device 305 to select a codeword length of 1944 for the one or more longer codewords 220 and include multiple codewords having a length of 1944 bits in the packet 215. For example, the first wireless device 205 may select a longest codeword length with a smallest quantity of shortening bits before potential symbol expansion. In some examples, the payload may include a large quantity of bits, such as more than 54432 bits, and the first wireless device 205 may produce multiple codewords having a codeword length of 31104 bits.

In some examples, the first wireless device 205 may select a longest codeword length with a least amount of change to the original codewords in the rate matching process. In some examples, the first wireless device 205 may select a codeword length with a small quantity of shortening bits to prevent over-puncturing a codeword, as a large quantity of shortening may be associated with a large quantity of puncturing. Shortening and puncturing may change a used code rate from an ideal code rate, which may affect efficiency. However, if two codeword lengths of different size result in a same quantity of shortening bits, the first wireless device 205 may select the longer codeword length between the two, as the longer codeword length may have better performance.

In another example, the first wireless device 205 may select a codeword length for the one or more longer codewords 220 according to a modulo operation on the quantity of payload bits. For example, the first wireless device 205 may select the codeword length according to Table 3.

TABLE 3

| Ranges of $N_{avbits}$ (bits) | Number of LDPC codewords ($N_{CW}$) | LDPC codeword length (bits) |
|---|---|---|
| $N_{avbits} \leq 648$ | 1 | 1296, if $N_{avbits} \geq N_{pld} + 912 \times (1 - R)$ 648, otherwise |
| $648 < N_{avbits} \leq 1296$ | 1 | 1944, if $N_{avbits} \geq N_{pld} + 1464 \times (1 - R)$ 1296, otherwise |

TABLE 3-continued

| Ranges of $N_{avbits}$ (bits) | Number of LDPC codewords ($N_{CW}$) | LDPC codeword length (bits) |
|---|---|---|
| $1296 < N_{avbits} \leq 1944$ | 1 | 1944 |
| $1944 < N_{avbits} \leq 2592$ | 2 | 1944, if $_{Navbits} \geq N_{pld} + 2916 \times (1 - R)$ 1296, otherwise |
| $2592 < N_{avbits}$ | $\left\lceil \dfrac{N_{pld}}{L_{LDPC} \cdot R} \right\rceil$ | 1944, if mod ($N_{avbits}$, 7776) < 1944 × 3 7776, if 1944 × 3 ≤ mod ($N_{avbits}$, 31104) < 1944 × 12 31104, otherwise |

In some examples, the first wireless device 205 may perform shortening or puncturing during rate matching when using a single codeword length. For a given quantity of shortening bits, $N_{shrt}$, and a given quantity of codewords, $N_{cw}$, a quantity of shortening bits per codeword, $N_{spcw}$, may be equal to $\lfloor N_{shrt}/N_{cw} \rfloor$. An actual quantity of shorted bits for a first mod ($N_{shrt}$, $N_{cw}$) codewords may be $N_{spcw}+1$, and the remaining codewords may include $N_{spcw}$ shortening bits each. For example, the quantity of shorted bits may not be evenly divisible by the quantity of codewords, so some codewords may receive one more shorted bit than others.

Given a quantity of puncturing bits, $N_{punc}$, the first wireless device 205 may determine whether an extra LDPC symbol segment is needed to avoid over-puncturing. For example, if either of Expression (1) or Expression (2) as described with reference to FIG. 1 are true, the first wireless device 205 may add an extra LDPC symbol segment. If the first wireless device 205 adds the extra LDPC symbol segment, $N_{avbits}$ may be adjusted according to Equation (3), and the first wireless device may recalculate $N_{punc}$ according to Equation (4).

$$N_{avbits} = \begin{cases} N_{avbits} + N_{CBPS} - 3N_{CBPS,short}, & \text{if } a_{init} = 3 \\ N_{avbits} + N_{CBPS,short}, & \text{otherwise} \end{cases} \quad (3)$$

$$N_{punc} = \max(0, N_{cw} \times L_{LDPC} - N_{shrt} - N_{avbits}) \quad (4)$$

After potentially adding an extra LDPC symbol segment, the first wireless device 205 may calculate the punctured bits per codeword, $N_{ppcw}$, as $N_{ppcw} = \lfloor N_{punc}/N_{cw} \rfloor$. In some examples, an actual quantity of punctured bits for the first mod($N_{punc}$, $N_{CW}$) codewords may be $N_{ppcw}+1$, and the remaining codewords may each be punctured by $N_{ppcw}$ bits. For example, the quantity of punctured bits may not be evenly divisible by the quantity of codewords, so some codewords may receive one more punctured bit than others.

In some examples, the first wireless device 205 may use a packet extension, which may provide additional processing time for the packet to the second wireless device 210. For example, padding one or more symbols as post-FEC padding may provide the second wireless device 210 with additional processing time. The quantity of extra symbols may be based on or otherwise associated with an RU size. For example, for RU sizes satisfying a threshold, such as RU sizes larger than 996, the first wireless device 205 may include a first quantity of additional symbols, such as one or two symbols. For RU sizes which do not satisfy the threshold, such as RU sizes smaller than 996, the first wireless device 205 may include a second quantity of additional symbols, such as four to eight additional symbols. In some examples, the quantity of symbols to be padded may be based on or otherwise associated with a quantity of coded bits per symbol, in which the quantity of coded bits per symbol is based on or otherwise associated with the RU size, MCS level, and a quantity of spatial streams used by the first wireless device 205 to transmit the packet 215.

In some examples, the first wireless device 205 may select a codeword length for the one or more longer codewords 220 based on or otherwise according to an RU size, an MCS level or a quantity of coded bits per symbol, or any combination thereof. For example, the first wireless device 205 may select a longer codeword length, such as 31104 bits, for RU sizes larger than or equal to a threshold, such as 996. Additionally, or alternatively, the first wireless device 205 may select the first codeword length, such as 31104 bits, when the first wireless device 205 is using an MCS with an MCS level above a threshold, such as MCS level 5 and above. Additionally, or alternatively, the first wireless device 205 may select the first codeword length, such as 31104 bits, in examples in which a quantity of coded bits per symbol is above a threshold, such as 5000 coded bits per symbol. In some examples, the thresholds or conditions for selecting a longer codeword length may be in addition to, or an alternative to, the $N_{avbits}$ thresholds described with reference to Table 2 and Table 3. For examples in which a codeword length of 31104 bits is only used for RU sizes larger than or equal to 996, then for an RU of size 242, even in examples in which $N_{avbits}$ is very large, the first wireless device 205 may not use a codeword length of 31104 bits. Similarly, for an RU of size 2×996, in examples in which $N_{avbits}$ is very small, the first wireless device 205 may still use a shorter codeword length, such as 648, 1296, or 1944 bits, instead of a longer codeword length.

In some examples, the first wireless device 205 may generate a packet containing codewords encoded using different codeword lengths. The first wireless device 205 may use one or more longer LDPC codewords, such as one or more longer codewords 220 each having a first codeword length, and one or more shorter LDPC codewords, such as one or more shorter codewords 225 each having a second codeword length that is smaller than the first codeword length. For example, the packet 215 may include one or more codewords having the first codeword length and one or more codewords having the second codeword length. In some examples, a codeword length for each of the one or more shorter codewords 225 may be referred to as a second codeword length, a short codeword length, or a shorter codeword length.

In some examples, the one or more shorter codewords 225 may be used for a last symbol of the packet 215. Using shorter codewords for the last symbol, or ensuring that the last OFDM symbol is only occupied by shorter LDPC codewords, may reduce processing time at the second wireless device 210. For example, the second wireless device 210 may process the packet 215 faster if the last symbol includes only shorter codewords than if the last symbol were to include longer codewords.

In some examples, the one or more shorter codewords 225 may each have a codeword length of 1944 bits. The first wireless device 205 may performing shortening or puncturing on the one or more longer codewords 220 or the one or more shorter codewords 225, or both. In some examples, the first wireless device 205 may perform proportional shortening and puncturing on the one or more longer codewords 220 and the one or more shorter codewords 225. For example, each of the one or more longer codewords 220 and each of the one or more shorter codewords 225 may be punctured or shortened a same, or approximately the same, percent. In some examples, each of the one or more longer codewords 220 may have a codeword length that is four times the codeword length of each of the one or more shorter codewords 225, and each of the one or more longer codewords 220 may include approximately four times as many shortening bits or punctured bits as each of the one or more shorter codewords 225. An example of proportional shortening and puncturing techniques is described in more detail with reference to FIG. 3.

In some examples, the first wireless device 205 may perform shortening and puncturing on each of the one or more shorter codewords 225, or codewords having the shorter codeword length, but not on the one or more longer codewords 220. In some examples, the first wireless device 205 may perform shortening and puncturing on the one or more longer codewords 220 but not on any of the one or more shorter codewords 225. In some examples, the first wireless device 205 may perform shortening on the one or more shorter codewords 225 and puncturing on the one or more longer codewords 220.

In some examples, the first wireless device 205 may perform shortening and puncturing on all codewords of the packet 215 equally in accordance with a quantity of codewords. For example, each codeword in the packet 215, including each of the one or more longer codewords 220 and each of the one or more shorter codewords 225, may include approximately a same quantity of puncturing bits such that each of the one or more shorter codewords 225 has a higher percentage of puncturing bits compared to each of the one or more longer codewords 220.

In some examples, the one or more shorter codewords 225 may each have a codeword length of 648, 1296, or 1944 bits. In some examples, shortening and puncturing may be distributed among all codewords, including the each of the one or more longer codewords 220 and each of the one or more shorter codewords 225, proportional to length-648 coded bits. In some examples, shortening and puncturing may be distributed among all codewords in accordance with a quantity of codewords in the packet 215. In some examples, shortening and puncturing may be distributed among the one or more shorter codewords 225 but not among the one or more longer codewords 220. In some examples, shortening and puncturing may be distributed among the one or more longer codewords 220 but not among the one or more shorter codewords 225. In some examples, shortening may be distributed among the one or more shorter codewords 225 but not among any of the one or more longer codewords 220, and puncturing may be distributed among the one or more longer codewords 220 but not among any of the one or more shorter codewords 225.

In some examples, the first wireless device 205 may use a same code rate for encoding the longer LDPC codewords and the shorter LDPC codewords in the packet 215. For example, the first wireless device 205 may use a same code rate to encode the one or more longer codewords 220 and the one or more shorter codewords 225.

In some other examples, the first wireless device 205 may use different code rates for shorter codewords and longer codewords. For example, a code rate used to encode the shorter LDPC codewords may be lower than a code rate used to encode the longer LDPC codewords. In some examples, using a lower code rate for the one or more shorter codewords 225 may reduce a performance gap between the one or more longer codewords 220 and the one or more shorter codewords 225. In some examples, the code rate for the one or more shorter codewords 225 may be one half. For example, regardless of a code rate used to encode the one or more longer codewords 220, the first wireless device 205 may use a code rate of one half to encode the one or more shorter codewords 225.

If the one or more shorter codewords 225 and the one or more longer codewords 220 have different code rates, the first wireless device 205 may perform puncturing and shortening on the longer codewords 220. Performing the puncturing and shortening on the longer codewords 220 may ensure there is no performance degradation to the shorter codewords and simplify the rate-matching procedure, as the symbols containing codewords using the shorter codeword length and the rest of the symbols may carry a different quantity of data bits per symbol. An initial quantity of the one or more shorter codewords 225 at a lower code rate may be determined based on or otherwise in accordance with a quantity of coded bits per symbol divided by a codeword length of the shorter codewords rounded up. Using the initial quantity of shorter codewords at the lower code rate, the first wireless device 205 may determine an initial quantity of information bits to be encoded using the lower code rate. Subtracting the initial quantity of information bits to be encoded using the lower code rate from the total quantity of information bits, the first wireless device 205 may determine a quantity of remaining information bits. The first wireless device 205 may use the quantity of remaining information bits with the MCS level to determine the codeword length of the longer codewords 220 for the remaining bits. After filling the one or more longer codewords 220, the first wireless device 205 may encode the remaining bits into the one or more shorter codewords 225 using the lower code rate.

In some other examples, the code rate for the one or more shorter codewords 225 may be determined after selecting codeword lengths. For example, after the first wireless device 205 selects a longer codeword length and a shorter codeword length, if the code rate based on or otherwise associated with the MCS level is not already the lowest code rate available, the shorter codewords may be replaced by shorter codewords having a lower code rate than associated with the MCS level. In this example, the first wireless device 205 may use an increased quantity of transmit symbols to accommodate for the shorter codewords having the lower code rate.

The first wireless device 205 may perform puncturing to fit the final encoded bits into the quantity of allotted OFDM symbols. However, puncturing an LDPC code may affect decoding performance of the LDPC codeword. The wireless communications system 200 may support techniques for a longer LDPC codeword without applying puncturing, by increasing a quantity of transmitted OFDM symbols to transmit all coded data. For example, the first wireless device 205 may increase the initial assigned quantity of symbols to accommodate the one or more longer codewords or the one or more shorter codewords 225. For example, the first wireless device 205 may increase the initial assigned quantity of symbols to transmit all coded data without performing puncturing.

The first wireless device 205 may include an indication that the packet 215 has an extended length to accommodate codewords without puncturing, such as in a header of the packet 215. For example, the first wireless device 205 may indicate a quantity of extended symbols as part of a physical layer header of the packet 215 to inform the second wireless device 210 of how many symbols are added to the initial calculated number of OFDM symbols, in order to accommodate the first wireless device 205 to skip performing puncturing. In some examples, the first wireless device 205 may indicate a quantity of information bits. In some examples, a mode without puncturing may be indicated via a field of control signaling, such as a bit indication in the header, or assumed as default operation by the first wireless device 205 and the second wireless device 210.

Figure 3:
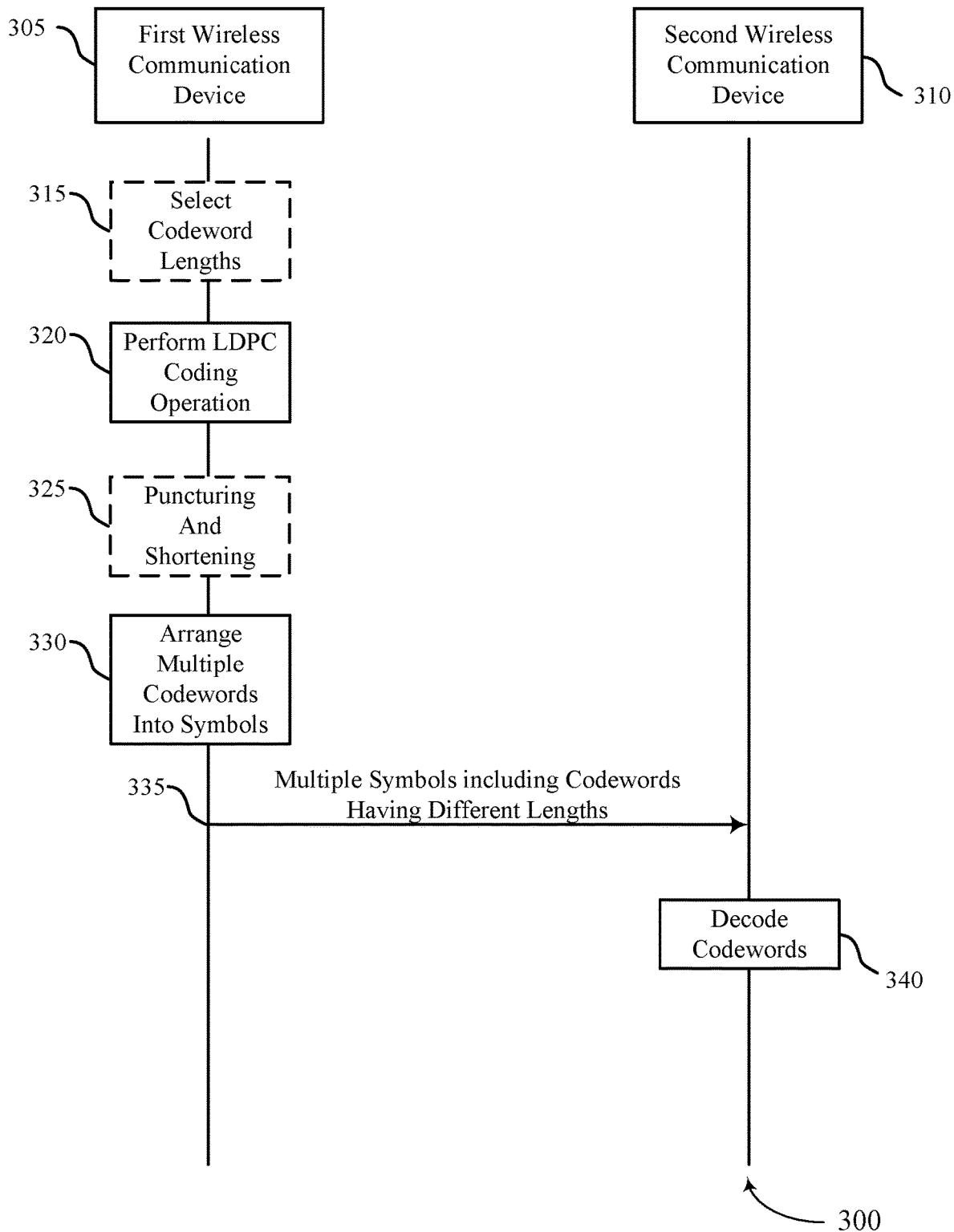
FIG. 3 illustrates an example of a process flow that supports techniques for generating and using longer LDPC codewords in accordance with one or more aspects of the present disclosure.

FIG. 3 illustrates an example of a process flow 300 that supports techniques for generating and using longer LDPC codewords in accordance with one or more aspects of the present disclosure. Aspects of the process flow 300 may implement, or be implemented by, aspects of the WLAN 100, the wireless communications system 200, or both. For example, the process flow 300 illustrates signaling and techniques that enable wireless communication devices to communicate packets having mixed codeword lengths, as shown and described with respect to FIGS. 1 and 2.

The process flow 300 may include a first wireless device 305 and a second wireless device 310, which may be examples of APs, STAs, and other wireless communication devices described with reference to FIGS. 1 and 2. For example, the first wireless device 305 and the second wireless device 310 illustrated in FIG. 3 may include examples of the first wireless device 205 and the second wireless device 210, respectively, as illustrated in FIG. 2.

In some examples, the operations illustrated in process flow 300 may be performed by hardware (for example, including circuitry, processing blocks, logic components, and other components), code (for example, software) executed by a processor, or any combination thereof. Alternative examples of the following may be implemented, in which some steps are performed in a different order than described or are not performed at all. In some cases, steps may include additional features not mentioned below, or further steps may be added.

The first wireless device 305 may have information bits or payload bits to transmit to the second wireless device 310 via a wireless channel. The process flow 300 illustrates examples of the first wireless device 305 selecting codeword lengths for codewords to convey the information bits, generating multiple codewords having different codeword lengths using the payload bits as input bits, arranging the multiple codewords into symbols, and transmitting the symbols to the second wireless device 310. In examples in which the first wireless device 305 selects a longer codeword, or a longer codeword length, the first wireless device 305 may use a shorter LDPC codeword, or a shorter codeword length, in conjunction with the longer codeword.

For example, at 315, the first wireless device 305 may select, based on, responsive to, or otherwise associated with a quantity of input bits satisfying a threshold, a first codeword length and a second codeword length. The first wireless device 305 may calculate, or determine, a quantity of coded bits that can be carried in a last OFDM symbol ($N_{cpbs,last}$), a quantity of initial OFDM symbols assigned ($N_{sym,init}$), and a quantity of available coded bits ($N_{avbits}$), each of which may be based on or otherwise associated with a quantity of payload bits ($N_{pld}$), an RU size, an MCS level, and an initial OFDM symbol boundary for the last symbol ($\alpha_{init}$). Based on or otherwise in accordance with the quantity of coded bits that can be carried in the last OFDM symbol, the first wireless device 305 may reserve a quantity of coded bits to be carried using shorter LDPC codewords ($N_{cbps,short}$) and the minimum quantity of shorter LDPC codewords to transmit the coded bits. If the shorter codeword length can be varied, such as being any of 648 bits, 1296 bits, or 1944 bits, the first wireless device 305 may select the shorter codeword length, or a second codeword length, based on or otherwise in accordance with $N_{cbps,last}$.

After determining the quantity of coded bits to be carried using the shorter LDPC codewords, the first wireless device 305 may determine a codeword length to be used for the remaining bits. For example, the first wireless device 305 may determine a longer codeword length, or a first codeword length, in accordance with the remaining $N_{avbits}-N_{cbps,short}$ bits. The first wireless device may use multiple longer codewords and use codewords with the shorter codeword length to carry the remaining bits.

For example, at 320, the first wireless device 305 may perform an LDPC coding operation on the input bits. The performance of the LDPC coding operation on the input bits may produce output bits arranged into multiple codewords. The multiple codewords may include one or more codewords each having the first codeword length and one or more codewords each having the second codeword length that is smaller than the first codeword length. At 325, the first wireless device 305 may perform puncturing or shortening, or both, on the one or more codewords having the first codeword length or on the one or more codewords having the second codeword length, or both. At 330, the first wireless device 305 may arrange the multiple codewords into multiple symbols such that a last symbol in time of the multiple symbols includes at least a portion of the one or more codewords having the second codeword length and no codewords having the first codeword length. At 335, the first wireless device 305 may transmit, to the second wireless device 310, the multiple symbols. At 340, the second wireless device 310 may decode the multiple symbols.

In some examples, the first wireless device 305 may select the longer codeword length from multiple longer codeword lengths and the shorter codeword length from multiple shorter codeword lengths. For example, the longer codeword length may be 7776 bits or 31104 bits. The shorter codeword length may be 648 bits, 1296 bits, or 1944 bits. In some examples, the shorter codeword length may be fixed, such as being set to 1944 bits, regardless of a quantity of coded bits to be carried using the shorter LDPC codewords.

In some examples, the process flow 300 may be performed to support various implementations for distributing puncturing and shortening between the codewords having the shorter codeword length and the codewords having the longer codeword length. In the following examples, the first wireless device 305 may use a single code rate for codewords with up to two different codeword lengths in a packet.

In a first example, the first wireless device 305 may distribute puncturing and shortening across all codeword proportional to the codeword lengths. For longer LDPC codeword lengths, such as where the payload results in a calculated quantity of $N_{avbits}>2592$, the first wireless device 305 may use a longer LDPC code length and a shorter LDPC codeword length, such as a length of 1944 bits, in combination for transmission of the same packet. In some examples, the last symbol may include only shorter codewords, or codewords having the shorter codeword length. The first wireless device 305 may perform shortening, puncturing, or padding across all of the codewords proportional to codeword length. For examples in which a packet includes a longer codeword having 31104 bits (4×1944 bits) and a shorter codeword having 1944 bits, the longer codeword may have approximately four times as many shortening bits per codeword as the length-1944 codeword.

In some cases of the first example, the shorter codeword length may be 1944 bits. The first wireless device 305 may determine a quantity of groups of coded bits, or coded blocks, having the shorter codeword length ($N_{cb,1944}$) in accordance with the code rate and a quantity of payload bits, where $$N_{cb,1944} = \left\lceil \frac{N_{pld}}{1944 * R} \right\rceil.$$

The first wireless device 305 may calculate a quantity of length-1944 coded blocks that can fit into a last symbol ($N_{cb,last}$) based on or otherwise associated with a quantity of coded bits for the last OFDM symbol ($N_{CBPS,last}$), where $$N_{cb,last} = \left\lceil \frac{N_{CBPS,last}}{1944} \right\rceil.$$

In some examples, $N_{CBPS,last}$ may be based on or otherwise associated with an RU size, MCS level, and initial segment boundary of the last symbol ($\alpha_{init}$). The first wireless device 305 may calculate a quantity of length-1944 coded blocks to be used for the remaining bits ($N_{cb,rem}$) based on or otherwise associated with the total quantity of length-1944 coded blocks and the quantity of length-1944 coded blocks that can be fit into the last symbol, in which $N_{cb,rem} = N_{cb,1944} - N_{cb,last}$. If the quantity of length-1944 coded blocks is less than 4, then the first wireless device 305 may only use length 1944 codewords, in which a total quantity of codewords is equal to the quantity of 1944-length coded blocks, or $N_{cw} = N_{cb,1944}$. If $4 \leq N_{cb,rem} < 16$, the first $$\left\lfloor \frac{N_{cb,rem}}{4} \right\rfloor$$

codewords may use a length 1944×4 codeword, and the remaining $$N_{cb,rem} - \left\lfloor \frac{N_{cb,rem}}{4} \right\rfloor \times 4,$$

together with the $N_{cb,last}$ codewords, may use a length 1944 codeword, in which $$N_{cw} = N_{cb,1944} - 3 \times \left\lfloor \frac{N_{cb,1944} - N_{cb,last}}{4} \right\rfloor.$$

If $N_{cb,rem} \geq 16$, the first $$\left\lfloor \frac{N_{cb,1944}}{4} \right\rfloor$$

codewords may use a length 1944×16 codeword, and the remaining $$N_{cb,1944} - \left\lfloor \frac{N_{cb,1944}}{16} \right\rfloor \times 16,$$

together with the $N_{cb,last}$ codewords, may use a length 1944 codeword, in which $$N_{cw} = N_{cb,1944} - 15 \times \left\lfloor \frac{N_{cb,1944} - N_{cb,last}}{4} \right\rfloor.$$

In some cases of the first example, a quantity of shortening, puncturing, or padding bits per codeword may be based on or otherwise associated with length-1944 encoded bit groups. The first wireless device 305 may apply the shortening, puncturing, or padding to each codeword in accordance with a quantity of length-1944 coded bit groups contained in each codeword. For example, a packet may include two longer codewords having codeword lengths of 1944×16 bits and three shorter codewords having codeword lengths of 1944 bits. A quantity of shortening bits may correspond to $N_{shrt} = \max(0, N_{cb,1944} \times 1944 \times R) - N_{pld}) > 0$. The first wireless device 305 may calculate a quantity of shorted bits per length-1944 coded bit group as $$N_{sp1944,init} = \left\lfloor \frac{N_{shrt}}{N_{CW,1944}} \right\rfloor.$$

An actual quantity of shorted bits per length-1944 coded bit group l may be denoted by $N_{sp1944}^{l}$. An actual quantity of shorted bits for the first mod ($N_{shrt}$, $N_{cw,1944}$) length-1944 coded bit groups may be $N_{sp1944,init}+1$, and the remaining coded bit groups may have $N_{sp1944,init}$ shorted bits each. In some examples, the actual quantity of shorted bits per codeword for the i-th codeword $N_{spcw,i}$) may be based on or otherwise associated with the first two length 1944×16 codewords, as denoted by Equation (5)

$$N_{spcw,i} = \sum_{j=(i-1)\times 16+1}^{i \times 16} N_{sp1944}^{j} \qquad (5)$$

The quantity of shorted bits per codeword for the i-th codeword may distributed among the three remaining length 1944 codewords according to $N_{spcw,i} = N_{sp1944}^{i+16 \times 2}$. In some examples, an extra OFDM symbol segment may be added to avoid a high percentage of puncturing based on or otherwise associated with the number of bits punctured per length-1944 coded bit group.

In some examples, the last symbol may not include only length-1944 codewords. For example, if $N_{avbits}$ satisfies a threshold, such as 2592 bits, a longer length LDPC code and a length 1944 LDPC code may be used in combination for a packet. The first wireless device 305 may distribute shortening, puncturing, or padding among all codewords and proportional to codeword lengths. For example, if length 4×1944 codewords and length 1944 codewords are used in a same packet, the length 4×1944 codewords may have approximately 4 times as many shortening bits per codeword as the length 1944 codewords. The first wireless device 305 may determine a quantity of length 1944 coded blocks or coded bit groups for $N_{pld}$. If the quantity of length 1944 coded blocks is less than 4, the first wireless device 305 may only use length 1944 codewords for the packet. If the quantity is from 4 to 15, the first wireless device 305 may use one or more length 1944×4 codewords for the first $$\left\lfloor \frac{N_{cb,1944}}{4} \right\rfloor$$

codewords and length 1944 codewords for the remaining codewords. If the quantity is greater than or equal to 16, the first wireless device 305 may use one or more length 1944×16 codewords for the first $$\left\lfloor \frac{N_{cb,1944}}{16} \right\rfloor$$

codewords and length 1944 codewords for the remaining codewords. A quantity of shortening, puncturing, or padding bits per codeword may be calculated based on length-1944 encoded bit groups, prior to determining the final codeword lengths. The shortening, puncturing, or padding may be applied to each codeword based on the quantity of length-1944 encoded bits contained in each codeword. The first wireless device 305 may determine whether to add an extra OFDM symbol segment based on the puncturing ratio of length-1944 encoded bit groups.

In a second example, the first wireless device 305 may only apply puncturing and shortening to the one or more codewords having the shorter codeword length. For example, any shortening or puncturing operation may be performed on the one or more codewords having the second, or shorter, codeword length. For the second example, the first wireless device 305 may determine a quantity of coded blocks, or coded bit groups, having the shorter codeword length without any adjustment to the last OFDM symbol. The first wireless device 305 may calculate a quantity of coded blocks having the shorter codeword length that can fit into the last OFDM symbol. The first wireless device 305 may determine a quantity of coded blocks for the remaining bits after determining the quantity of coded blocks that can fit into the last OFDM symbol. In some cases of the second examples, the shorter codeword length may be 1944 bits. If the total quantity of coded blocks for the remaining coded bits is less than four, then the first wireless device 305 may use only codewords having the shorter codeword length, such as 1944 bits, for a packet. In examples in which the quantity of coded blocks is greater than or equal to 4 and less than 16, the first $$\left\lfloor \frac{N_{cb,rem}}{4} \right\rfloor$$

codewords may have a length of 7776 bits, and the remaining $$N_{cb,rem} - \left\lfloor \frac{N_{cb,rem}}{4} \right\rfloor \times 4$$

codewords together with the quantity of coded blocks for the last codewords, $N_{cb,last}$, may have a length of 1944 bits, such that the quantity of codewords encoded using the codeword length of 1944 is equal to $$N_{cb,1944} - 3 \times \left\lfloor \frac{N_{cb,1944} - N_{cb,last}}{4} \right\rfloor.$$

In examples in which the quantity of coded blocks is greater than or equal to 16, the first $$\left\lfloor \frac{N_{cb,1944}}{4} \right\rfloor$$

codewords may use a length 7776 codeword, and the remaining $$N_{cb,rem} - \left\lfloor \frac{N_{cb,rem}}{4} \right\rfloor \times 4$$

codewords and the quantity of coded blocks for the last codewords may use a length 1944 codeword, such that the quantity of codewords encoded using the codeword length of 1944 is equal to $$N_{cb,1944} - 15 \times \left\lfloor \frac{N_{cb,1944} - N_{cb,last}}{16} \right\rfloor.$$

For the second example, the first wireless device 305 may perform shortening and puncturing across codewords having the second, or shorter, codeword length. For example, a total quantity of shortened bits may be denoted by Equation (6), in which $N_{cw,short}$ denotes a quantity of codewords having the shorter codeword length (1944), $N_{cw}$ denotes a total quantity of codewords including both longer and shorter codewords, $L_{LDPC,long}$ denotes a length of the longest codeword used, $L_{LDPC,short}$ denotes a length of the shortest codeword used, and R denotes the code rate.

$$N_{shrt} = \max(0, N_{cw,short} \times L_{LDPC,short} \times R) - \qquad (6)$$
$$(N_{pld} - (N_{cw} - N_{cw,short}) \times L_{LDPC,long} \times R))$$

A quantity of shorted bits per codeword having the shorter LDPC codeword length may be denoted by $N_{spshort,init}$, in which $N_{spshort,init} = \lfloor N_{shrt}/N_{cw,short} \rfloor$. In some examples, an actual quantity of shorted bits for a first $\mod(N_{shrt}, N_{cw,short})$ codewords having the shorter codeword length may be $N_{spshort,init}+1$, and the remaining codewords may include $N_{spshort,init}$ shorted bits each.

For the second example, the first wireless device 305 may determine a quantity of puncturing bits per shorter codeword. A total quantity of puncturing bits, $N_{punc}$, may be determined according to Equation (7).

$$N_{punc} = \max(0, \qquad (7)$$
$$(N_{cw} - N_{cw,short}) \times L_{LDPC,long} + N_{cw,short} \times L_{LDPC,short} - N_{shrt} - N_{avbits})$$

In some examples, the first wireless device 305 may adjust a last symbol to avoid applying too much puncturing and impacting the performance of the LDPC code. For examples in which either Expression (8) or Expression (9) is true, the first wireless device 305 may include an extra LDPC symbol segment, which may increase $N_{avbits}$.

$$N_{punc} > 0.1 \times N_{cw,short} \times L_{LDPC,short} \times (1-R)) \quad (8)$$

$$\text{AND} \left( N_{shrt} < 1.2 \times N_{punc} \times \frac{R}{1-R} \right)$$

$$(N_{punc} > 0.3 \times N_{cw,short} \times L_{LDPC,short} \times (1-R)) \quad (9)$$

The first wireless device 305 may then recalculate $N_{avbits}$ and $N_{punc}$ in accordance with Equations (10) and (11), respectively.

$$N_{avbits} = \begin{cases} N_{avbits} + N_{CBPS} - 3 \, N_{CBPS,short}, \text{ if } a_{init} = 3 \\ N_{avbits} + N_{CBPS,short}, \text{ otherwise} \end{cases} \quad (10)$$

$$N_{punc} = \max(0, \quad (11)$$
$$(N_{cw} - N_{cw,short}) \times L_{LDPC,long} + N_{cw,short} \times L_{LDPC,short} - N_{shrt} - N_{avbits})$$

If the first wireless device 305 adds the extra LDPC symbol segment, the first wireless device 305 may determine whether the last symbol is still encoded using only codewords having the shorter codeword length. For example, the first wireless device 305 may determine $N_{CBPS,last}$ according to Equation (12).

$$N_{CBPS,last} = \begin{cases} a \cdot N_{CBPS,short}, \text{ if } a < 4 \\ N_{CBPS}, \text{ if } a = 4 \end{cases} \quad (12)$$

The first wireless device 305 may recompute a quantity of codewords with the shorter codeword length that can be fit into the last symbol. For example, the quantity of shorter codewords that can fit into the last symbol, $N_{cb,last}$, may be equal to $$\left\lceil \frac{N_{CBPS,last}}{L_{LDPC,short}} \right\rceil.$$

If $N_{cb,last}$ is less than or equal to a current assigned quantity of codewords having the shorter codeword length, such as 1944 bits, then the first wireless device 305 may not make an adjustment, as the last symbol may still only include codewords having the shorter codeword length. In examples in which $N_{cb,last}$ is greater than $N_{cw,short}$, the first wireless device 305 may calculate a new $N_{cb,rem}$ from a difference between $N_{cb,short}$ and $N_{cb,last}$. The first wireless device 305 may update a total quantity of codewords, $N_{cw}$, a quantity of codewords having the shorter codeword length, $N_{cw,short}$, and a length of the longer LDPC codeword, $L_{LDPC,long}$. After updating $N_{cw}$, $N_{cw,short}$, and $L_{LDPC,long}$, the first wireless device 305 may recompute a quantity of shortening and puncturing bits using Equations (6) and (7) with the updated values.

In a third example, the first wireless device 305 may distribute shortening and puncturing to all codewords evenly. Shortening and puncturing may be distributed across all codewords proportional to codeword length in the first example, but shortening and puncturing may be distributed across all codewords evenly regardless of length of the individual codewords in the third example. For example, a codeword having a shorter codeword length and a codeword having a longer codeword length may have a same, or approximately a same, quantity of shortening bits. Additionally, or alternatively, the codeword having the shorter codeword length and the codeword having the longer codeword length may have a same, or approximately a same, quantity of punctured bits. In some examples, one or more codewords may include one additional shortening bit or one additional punctured bit compared to other codewords, as the quantity of shortening bits or punctured bits may not be evenly divisible by the total quantity of codewords.

For the third example, the first wireless device 305 may determine whether to use an extra OFDM symbol segment to avoid over-puncturing. For example, if Expression (13) or Expression (14) is true, the first wireless device 305 may use the extra LDPC symbol segment.

$$(N_{punc} > \quad (13)$$
$$0.1 \times (N_{cw,1944} \times 1944 + (N_{cw} - N_{cw,1944}) \times L_{LDPC,long}) \times (1-R))$$
$$\text{AND} \left( N_{shrt} < 1.2 \times N_{punc} \times \frac{R}{1-R} \right)$$

$$N_{punc} > 0.3 \times N_{CW,1944} \times 1944 + (N_{cw} - N_{CW,1944}) \times L_{LDPC,long}) \times (1-R) \quad (14)$$

If the extra LDPC symbol segment is used for the third example, the first wireless device 305 may increase $N_{avbits}$ and recompute $N_{punc}$. If the extra symbol segment is used, the first wireless device 305 may check whether the last symbol is still encoded using only length-1944 symbols, and the first wireless device 305 may make adjustments, as described in more detail in the second example, if the last symbol is not still encoded using only length-1944 symbols.

In a fourth example, the first wireless device 305 may perform shortening and puncturing only on codewords having a first, longer codeword length. For example, the first wireless device 305 may determine quantities of shortening bits and puncturing bits from Equations (4) through (10), but instead of using the shorter codeword length, or 1944 bits, Equations (4) through (10) may use the longer codeword length, $L_{LDCP,long}$. For example, a total quantity of shorted bits may be determined according to Equation (15), in which $N_{cw,long}$ denotes a quantity of longer codewords used, $N_{cw}$ denotes a total quantity of all codewords, and $L_{LDPC}$,long denotes a length of the longest codeword used. A total quantity of punctured bits may be determined according to Equation (16), which may be similar to Equation (7), but exchanging the length of the longer LDPC codeword and the shorter LDPC codeword.

$$N_{shrt} = \max(0, N_{cw,long} \times L_{LDPC,long} \times R) - \quad (15)$$
$$(N_{pld} - (N_{cw} - N_{cw,long}) \times L_{LDPC,long} \times R))$$

$$N_{punc} = \max \quad (16)$$
$$(0, (N_{cw} - N_{cw,long}) \times L_{LDPC,short} + N_{cw,long} \times L_{LDPC,long} - N_{shrt} - N_{avbits})$$

For the fourth example, the first wireless device 305 may determine whether to use an extra OFDM symbol segment to avoid over-puncturing. For example, if Expression (17) or Expression (18) is true, the first wireless device 305 may use the extra LDPC symbol segment.

$$(N_{punc} > 0.1 \times (N_{cw,long} \times L_{LDPC,long}) \times (1-R)) \quad (17)$$

$$\text{AND} \left( N_{shrt} < 1.2 \times N_{punc} \times \frac{R}{1-R} \right)$$

$$N_{punc} > 0.3 \times N_{CW,long} \times L_{LDPC,long} \times (1-R) \quad (18)$$

If the extra LDPC symbol segment is used for the fourth example, the first wireless device 305 may increase $N_{avbits}$ and recompute $N_{punc}$. If the extra symbol segment is used, the first wireless device 305 may check whether the last symbol is still encoded using only length-1944 symbols, and the first wireless device 305 may make adjustments, as described in more detail in the second example, if the last symbol is not still encoded using only length-1944 symbols.

In a fifth example, the first wireless device 305 may use a single code rate for codewords with up to two different codeword lengths in a packet, and the first wireless device 305 may perform shortening only on codeword having a second, shorter codeword length and perform puncturing only on codewords having a first, longer codeword length. For example, instead of applying both shortening and puncturing bits across either longer codewords or shorter codewords, the first wireless device 305 may apply shortening to codeword having the shorter codeword length and apply puncturing to codewords having the longer codeword length. For example, the first wireless device 305 may determine shortening bits according to Equation (6) and distribute shortening bits and perform shortening operation almost evenly amongst only the codewords with the shorter codeword length. The first wireless device 305 may determine puncturing bits according to Equation (16) and performing the puncturing operation almost evenly amongst only the codewords with the longer codeword length. In some examples, the first wireless device 305 may apply shortening to all codewords, proportional to codeword lengths as described in the first example or evenly as described in the third example, and apply puncturing to only codewords having the longer codeword length as described in the fourth example.

In the first through fifth examples, a shorter codeword length of 1944 bits is generally described. However, for each of these examples, the shorter codeword length may be a different quantity of bits. For example, the shorter codeword length may be 648 bits or 1296 bits. Codeword length selection, shortening, and puncturing may be modified in accordance with the different shorter codeword lengths. For example, shortening and puncturing may be distributed among all codewords proportional to length-648 coded bits. In some examples, shortening and puncturing may be distributed among shorter codewords only, the shorter codewords having a codeword length of 648 bits or 1296 bits.

For example, a last symbol codeword length may be based on or otherwise associated with an LDPC codeword length selection rule. For example, if two codeword lengths are used, the first wireless device 305 may determine the second, shorter codeword length in accordance with a quantity of available coded bits in the last symbol. The first wireless device 305 may determine the longer codeword length after determining the shorter codeword length and the quantity of shorter codewords used to fill the last symbol. In some examples, the shorter codeword length may be 648 bits, 1296 bits, or 1944 bits. The first wireless device 305 may perform puncturing or shortening as described with reference to one or more examples above.

In some examples of the LDPC codeword length selection rule, the first wireless device 305 may determine the longer codeword length first. For example, the first wireless device 305 may determine an initial quantity of payload bits for the longer codeword, $N_{pld,long,init}$ from a difference between the quantity of payload bits and an initial quantity of information bits per symbol in the last symbol. In examples in which $N_{pld,long,init}$ is below a first threshold, such as 7776×R, then only length 1944 codewords may be used, and the first wireless device 305 may set the longer codeword length and the shorter codeword length to be equal to 1944 bits. In examples in which $N_{pld,long,init}$ is equal to or above the first threshold but below a second threshold, such as 31104×R, then $L_{LDPC,long}$ may be set to a first longer codeword length, such as 7776 bits, and a remaining quantity of payload bits, $N_{pld,rem}$, may be equal to a difference between $N_{pld}$ and $N_{cw,long}$×7776×R. The first wireless device 305 may use $N_{pld,rem}$ in place of $N_{avbits}$ and select the shorter codeword lengths and a quantity of shorter codewords using techniques described herein, such as using Table 1. In examples in which $N_{pld,long,init}$ is equal to or above the second threshold, then $L_{LDPC}$, long may be set to a second longer codeword length, such as 31104 bits, and a remaining quantity of payload bits, $N_{pld,rem}$, may be equal to a difference between $N_{pld}$ and $N_{cw,long}$×31104×R. The first wireless device 305 may similarly use $N_{pld,rem}$ in place of $N_{avbits}$ and select the shorter codeword lengths and a quantity of shorter codewords using techniques described herein.

After generating the codewords according to any one or more of the examples or techniques described herein, the first wireless device 305 may, at 330, arrange the multiple codewords into multiple symbols such that a last symbol in time of the multiple symbols includes at least a portion of the one or more codewords having the second codeword length and no codewords having the first codeword length. The first wireless device 305 may transmit, to the second wireless device 310, the multiple symbols, and the second wireless device 310 may decode the multiple symbols.

In some examples, the second wireless device 310 may decode the multiple symbols in accordance with one or more decoding techniques which may mirror the encoding procedures described herein. For example, the second wireless device 310 may decode, based on, responsive to, or otherwise associated with the last symbol of the multiple symbols including one or more codewords having the second codeword length and no codewords having the first codeword length, the multiple symbols including the one or more codewords having the first codeword length and the one or more codewords having the second codeword length to obtain the input bits or payload bits. For example, the second wireless device 310 may first decode one or more first-received symbols, which may correspond to the one or more codewords having the first codeword length, then the second wireless device 310 may decode the codewords associated with the last symbol after decoding the earlier-received codewords.

While the examples of codeword length selection, shortening, and puncturing described with reference to FIG. 3 generally relate to using a single code rate for both longer and shorter codewords, some of these examples may also be applied when using different code rates for longer and shorter codewords. For example, the first wireless device 305 may use a lower code rate to encode the one or more codewords having the second codeword length, such as a code rate of one half. In some examples, the first wireless device 305 may perform shortening and puncturing, if needed, on the longer codewords as described in more detail in the fourth example and with respect to FIG. 2.

Figure 4:
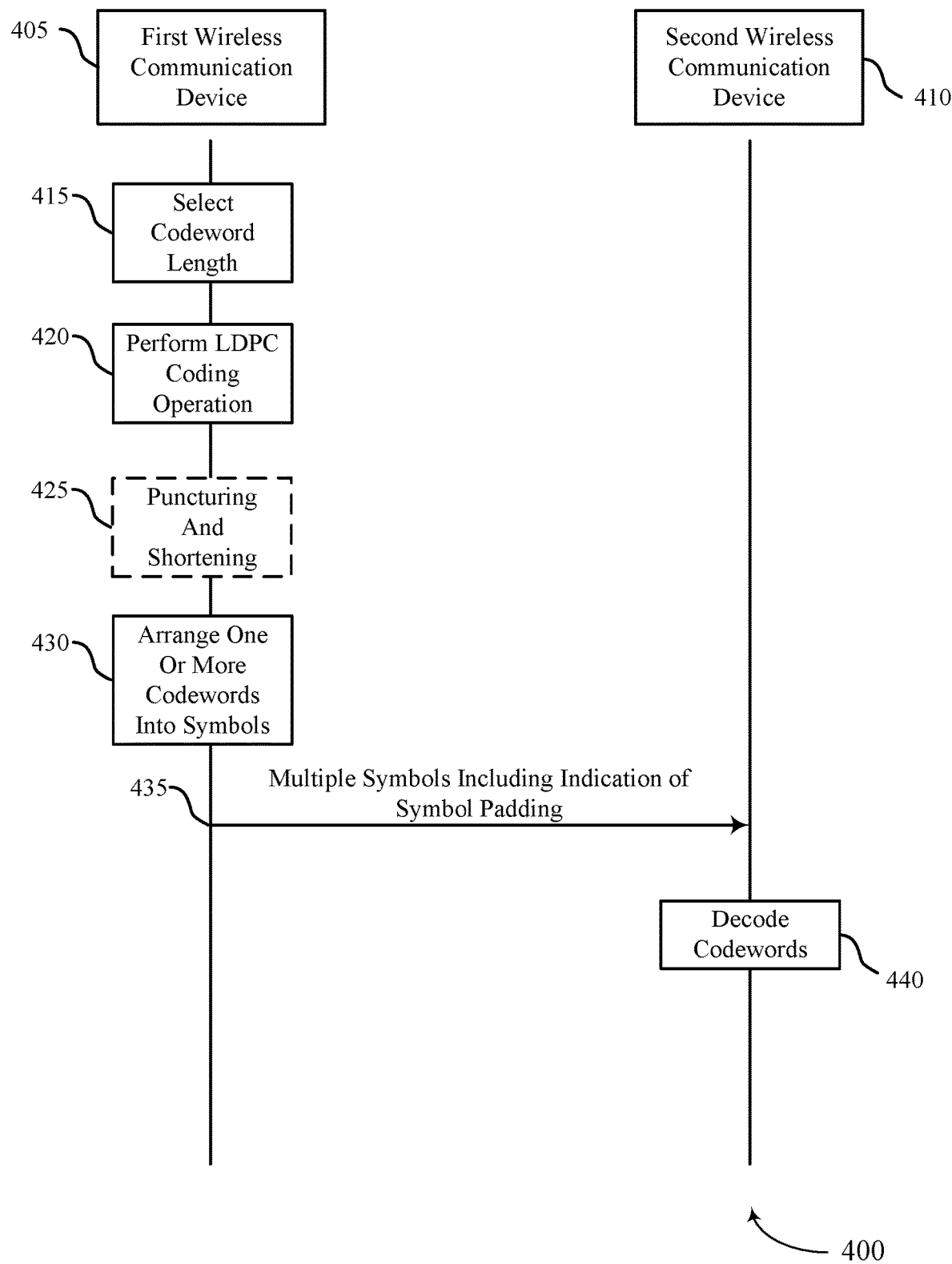
FIG. 4 illustrates an example of a process flow that supports techniques for generating and using longer LDPC codewords in accordance with one or more aspects of the present disclosure.

FIG. 4 illustrates an example of a process flow 400 that supports techniques for generating and using longer LDPC codewords in accordance with one or more aspects of the present disclosure. Aspects of the process flow 400 may implement, or be implemented by, aspects of the WLAN 100, the wireless communications system 200, the process flow 300, or any combination thereof. For example, the process flow 400 illustrates signaling and techniques that enable wireless communication devices to communicate codewords having a longer codeword length, as shown and described with respect to FIGS. 1 and 2.

The process flow 400 may include a first wireless device 405 and a second wireless device 410, which may be examples of APs, STAs, and other wireless communication devices described with reference to FIGS. 1 and 2. For example, the first wireless device 305 and the second wireless device 310 illustrated in FIG. 3 may include examples of an encoding device or transmitting device and a decoding or receiving device, respectively.

In some examples, the operations illustrated in process flow 400 may be performed by hardware (for example, including circuitry, processing blocks, logic components, and other components), code (for example, software) executed by a processor, or any combination thereof. Alternative examples of the following may be implemented, in which some steps are performed in a different order than described or are not performed at all. In some cases, steps may include additional features not mentioned below, or further steps may be added.

The first wireless device 405 may have information bits or payload bits to transmit to the second wireless device 410 via a wireless channel. The process flow 400 illustrates examples of the first wireless device 405 selecting a codeword length for one or more codewords to convey the information bits, generating the one or more codewords using the payload bits as input bits, arranging the one or more codewords into symbols, and transmitting the symbols to the second wireless device 410.

For example, at 415, the first wireless device 405 may select, based on, responsive to, or otherwise associated with a quantity of input bits satisfying a threshold, a first codeword length for the one or more codewords. In some examples, the first wireless device 405 may determine a quantity of payload bits from the APEP_LENGTH. The first wireless device 405 may determine an initial quantity of symbols based on or otherwise associated with the quantity of payload bits and a quantity of data bits per symbol. The first wireless device 405 may determine a quantity of available bits based on or otherwise associated with the initial quantity of symbols, a last symbol boundary (a), and a quantity of coded bits per symbol. The first wireless device 405 may select the codeword length associated with the quantity of available bits, such as using Table 2 or Table 3 described herein.

For example, at 420, the first wireless device 405 may perform an LDPC coding operation on the set of multiple input bits. The performance of the LDPC coding operation on the input bits may produce a set of multiple output bits arranged into one or more codewords. The one or more codewords may each have a codeword length that is based on or otherwise associated with a size of an RU satisfying a first threshold, a modulation and coding scheme index for the LDPC coding operation satisfying a second threshold, a quantity of coded bits per symbol satisfying a third threshold, or any combination thereof.

For example, the first wireless device 405 may use a longer codeword length, such as 7776 or 31104, in examples in which one or more conditions are satisfied. For example, a first longer codeword size, such as 31104 bits, may be selected in examples in which a size of an RU satisfies a threshold. For example, the first wireless device 405 may select the first longer codeword size in examples in which an RU size is larger than or equals to 996. In another example, the first wireless device 405 may select the first longer codeword size in examples in which an MCS index satisfies a threshold, such as in examples in which an MCS index is set to five or above. In another example, the first wireless device 405 may select the first longer codeword size in examples in which a quantity of coded bits per symbol satisfies a threshold, such as in examples in which the quantity of coded bits per symbol is larger than 5000.

In some examples, the first wireless device 405 may perform packet extension to assist with processing time at the second wireless device 410. For example, padding of an extra symbol, or several extra symbols, may provide the decoder (the second wireless device 410) with additional processing time. A quantity of symbols to be padded may be based on or otherwise associated with the RU sizes. For example, for RU sizes larger than 996, the first wireless device 405 may pad one to two extra symbols. For RU sizes less than 996, four to eight symbols may be padded. In some examples, the quantity of symbols to be padded may be based on or otherwise associated with a quantity of coded bits per symbol. In some examples, the first wireless device 405 may include a header with a packet including the one or more symbols. The quantity of symbols to be padded may be selected from a table of supported values or quantities, and the first wireless device 405 may indicate the selected quantity of symbols as part of a header of the packet.

In some examples, the first wireless device 405 may perform puncturing or shortening, or both, on the one or more codewords at 425. At 430, the first wireless device 405 may arrange the one or more codewords into multiple symbols including one or more padded symbols after FEC. At 435, the first wireless device 405 may transmit, to the second wireless device 410, the multiple symbols. At 440, the second wireless device 410 may decode the multiple symbols.

Figure 5:
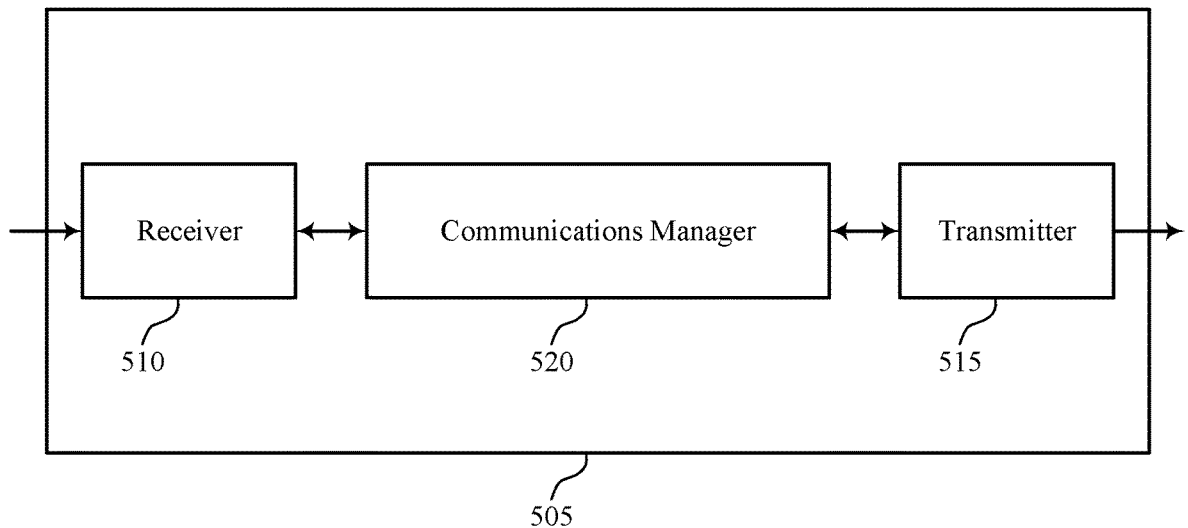
FIGS. 5 and 6 illustrate block diagrams of devices that support techniques for generating and using longer LDPC codewords in accordance with one or more aspects of the present disclosure.

FIG. 5 illustrates a block diagram of a device 505 that supports techniques for generating and using longer LDPC codewords in accordance with one or more aspects of the present disclosure. The device 505 may be an example of aspects of an AP or an STA as described herein. The device 505 may include a receiver 510, a transmitter 515, and a communications manager 520. The device 505 may also include a processor. Each of these components may be in communication with one another (for example, via one or more buses).

The receiver 510 may provide a means for receiving information such as packets, user data, control information, or any combination thereof associated with various information channels (for example, control channels, data channels, information channels related to techniques for generating and using longer LDPC codewords). Information may be passed on to other components of the device 505. The receiver 510 may utilize a single antenna or a set of multiple antennas.

The transmitter 515 may provide a means for transmitting signals generated by other components of the device 505. The transmitter 515 may utilize a single antenna or a set of multiple antennas.

The communications manager 520, the receiver 510, the transmitter 515, or various combinations thereof or various components thereof may be examples of means for performing various aspects of techniques for generating and using longer LDPC codewords as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (for example, in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (for example, by executing, by the processor, instructions stored in the memory).

Additionally, or alternatively, in some examples, the communications manager 520, the receiver 510, the transmitter 515, or various combinations or components thereof may be implemented in code (for example, as communications management software or firmware) executed by a processor. If implemented in code executed by a processor, the functions of the communications manager 520, the receiver 510, the transmitter 515, or various combinations or components thereof may be performed by a general-purpose processor, a DSP, a CPU, an ASIC, an FPGA, a microcontroller, or any combination of these or other programmable logic devices (for example, configured as or otherwise supporting a means for performing the functions described in the present disclosure).

In some examples, the communications manager 520 may be configured to perform various operations (for example, receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications at a first wireless device in accordance with examples as disclosed herein. For example, the communications manager 520 may be configured as or otherwise support a means for performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The communications manager 520 may be configured as or otherwise support a means for arranging the set of multiple codewords into a set of multiple symbols such that a last symbol in time of the set of multiple symbols includes at least a portion of the one or more codewords each having the second codeword length and no codewords having the first codeword length. The communications manager 520 may be configured as or otherwise support a means for transmitting, to a second wireless device, the set of multiple symbols.

Additionally, or alternatively, the communications manager 520 may support wireless communications at a first wireless device in accordance with examples as disclosed herein. For example, the communications manager 520 may be configured as or otherwise support a means for performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. The communications manager 520 may be configured as or otherwise support a means for arranging the one or more codewords into a set of multiple symbols including one or more padded symbols after a forward error correction. The communications manager 520 may be configured as or otherwise support a means for transmitting, to a second wireless device via the RU, the set of multiple symbols with a header indicating a quantity of the one or more padded symbols.

Additionally, or alternatively, the communications manager 520 may support wireless communications at a second wireless device in accordance with examples as disclosed herein. For example, the communications manager 520 may be configured as or otherwise support a means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The communications manager 520 may be configured as or otherwise support a means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Additionally, or alternatively, the communications manager 520 may support wireless communications at a second wireless device in accordance with examples as disclosed herein. For example, the communications manager 520 may be configured as or otherwise support a means for receiving, from a first wireless device, a set of multiple symbols with a header indicating a quantity of one or more padded symbols included after a forward error correction. The communications manager 520 may be configured as or otherwise support a means for decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof.

By including or configuring the communications manager 520 in accordance with examples as described herein, the device 505 (for example, a processor controlling or otherwise coupled with the receiver 510, the transmitter 515, the communications manager 520, or a combination thereof)

may support techniques for increased gain and more efficient utilization of communication resources.

Figure 6:
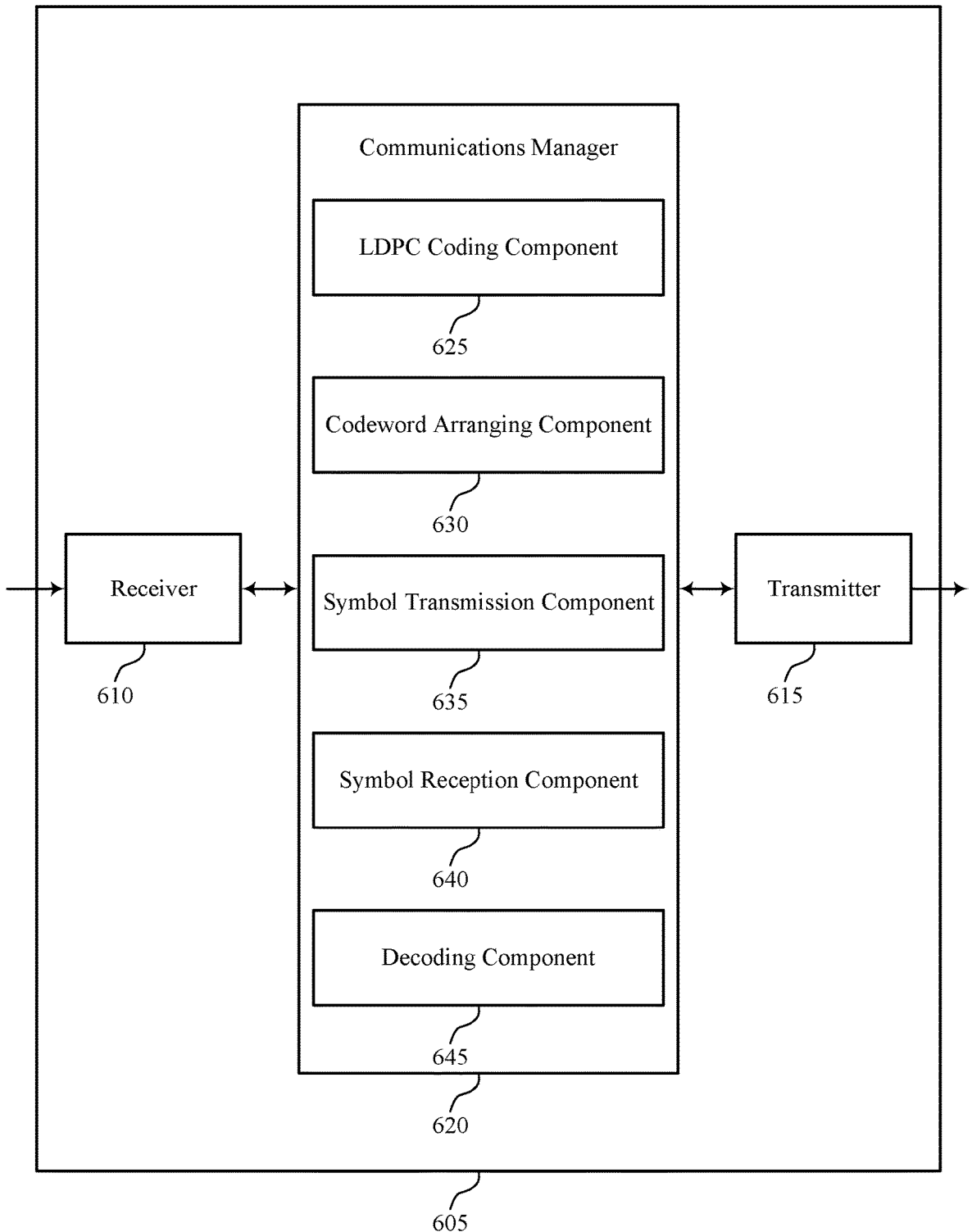

FIG. 6 illustrates a block diagram of a device 605 that supports techniques for generating and using longer LDPC codewords in accordance with one or more aspects of the present disclosure. The device 605 may be an example of aspects of a device 505, an AP 102, or an STA 104 as described herein. The device 605 may include a receiver 610, a transmitter 615, and a communications manager 620. The device 605 may also include a processor. Each of these components may be in communication with one another (for example, via one or more buses).

The receiver 610 may provide a means for receiving information such as packets, user data, control information, or any combination thereof associated with various information channels (for example, control channels, data channels, information channels related to techniques for generating and using longer LDPC codewords). Information may be passed on to other components of the device 605. The receiver 610 may utilize a single antenna or a set of multiple antennas.

The transmitter 615 may provide a means for transmitting signals generated by other components of the device 605. The transmitter 615 may utilize a single antenna or a set of multiple antennas.

The device 605, or various components thereof, may be an example of means for performing various aspects of techniques for generating and using longer LDPC codewords as described herein. For example, the communications manager 620 may include an LDPC coding component 625, a codeword arranging component 630, a symbol transmission component 635, a symbol reception component 640, a decoding component 645, or any combination thereof. In some examples, the communications manager 620, or various components thereof, may be configured to perform various operations (for example, receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications at a first wireless device in accordance with examples as disclosed herein. The LDPC coding component 625 may be configured as or otherwise support a means for performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The codeword arranging component 630 may be configured as or otherwise support a means for arranging the set of multiple codewords into a set of multiple symbols such that a last symbol in time of the set of multiple symbols includes at least a portion of the one or more codewords each having the second codeword length and no codewords having the first codeword length. The symbol transmission component 635 may be configured as or otherwise support a means for transmitting, to a second wireless device, the set of multiple symbols.

Additionally, or alternatively, the communications manager 620 may support wireless communications at a first wireless device in accordance with examples as disclosed herein. The LDPC coding component 625 may be configured as or otherwise support a means for performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. The codeword arranging component 630 may be configured as or otherwise support a means for arranging the one or more codewords into a set of multiple symbols including one or more padded symbols after a forward error correction. The symbol transmission component 635 may be configured as or otherwise support a means for transmitting, to a second wireless device via the RU, the set of multiple symbols with a header indicating a quantity of the one or more padded symbols.

Additionally, or alternatively, the communications manager 620 may support wireless communications at a second wireless device in accordance with examples as disclosed herein. The symbol reception component 640 may be configured as or otherwise support a means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The decoding component 645 may be configured as or otherwise support a means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

Additionally, or alternatively, the communications manager 620 may support wireless communications at a second wireless device in accordance with examples as disclosed herein. The symbol reception component 640 may be configured as or otherwise support a means for receiving, from a first wireless device, a set of multiple symbols with a header indicating a quantity of one or more padded symbols included after a forward error correction. The decoding component 645 may be configured as or otherwise support a means for decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof.

Figure 7:
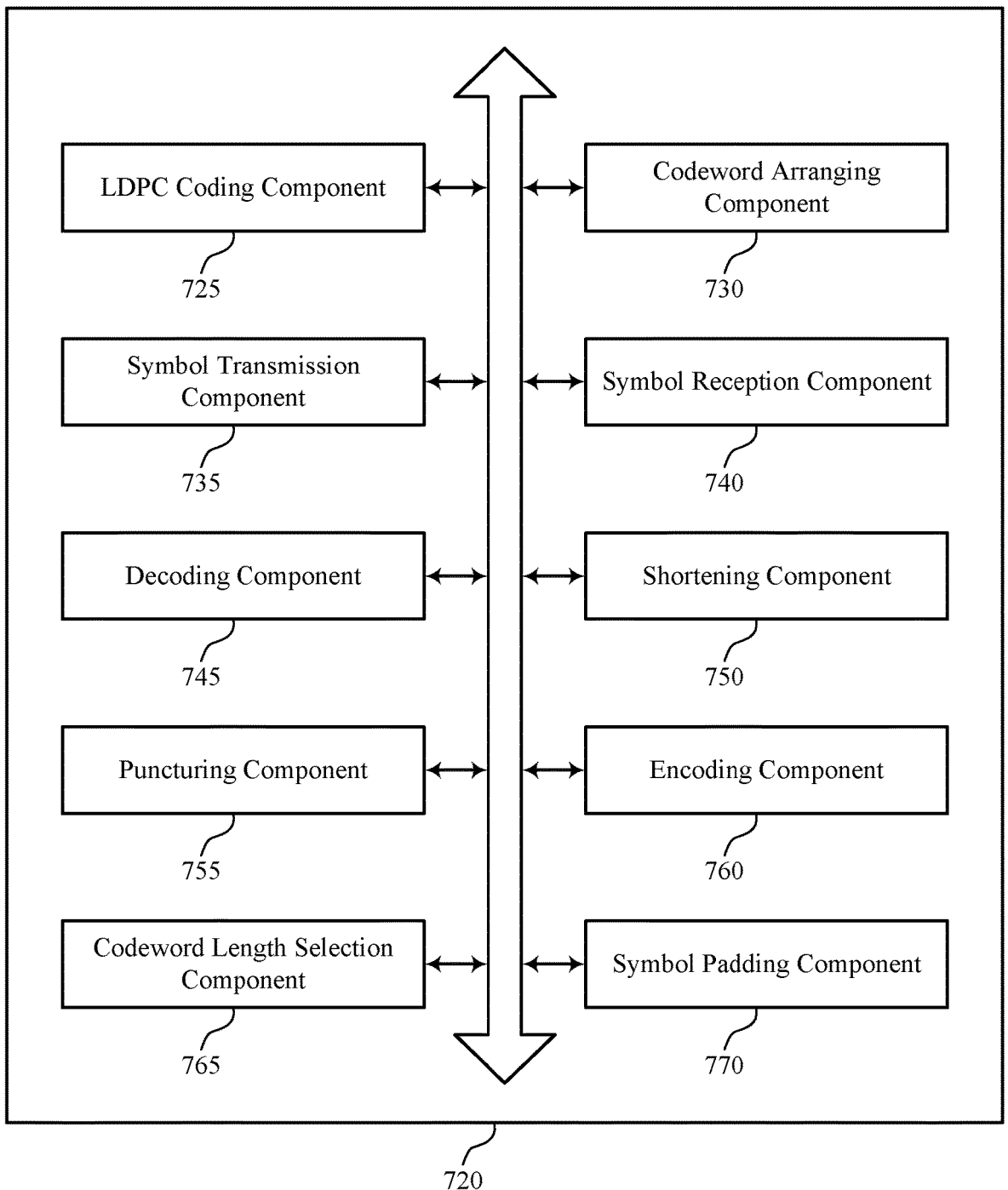
FIG. 7 illustrates a block diagram of a communications manager that supports techniques for generating and using longer LDPC codewords in accordance with one or more aspects of the present disclosure.

FIG. 7 illustrates a block diagram of a communications manager 720 that supports techniques for generating and using longer LDPC codewords in accordance with one or more aspects of the present disclosure. The communications manager 720, or various components thereof, may be an example of means for performing various aspects of techniques for generating and using longer LDPC codewords as described herein. For example, the communications manager 720 may include an LDPC coding component 725, a codeword arranging component 730, a symbol transmission component 735, a symbol reception component 740, a decoding component 745, a shortening component 750, a puncturing component 755, an encoding component 760, a codeword length selection component 765, a symbol padding component 770, or any combination thereof. Each of these components may communicate, directly or indirectly, with one another (for example, via one or more buses).

The communications manager 720 may support wireless communications at a first wireless device in accordance with examples as disclosed herein. The LDPC coding component 725 may be configured as or otherwise support a means for performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The codeword arranging component 730 may be configured as or otherwise support a means for arranging the set of multiple codewords into a set of multiple symbols such that a last symbol in time of the set of multiple symbols includes at least a portion of the one or more codewords each having the second codeword length and no codewords having the first codeword length. The symbol transmission component 735 may be configured as or otherwise support a means for transmitting, to a second wireless device, the set of multiple symbols.

In some examples, the shortening component 750 may be configured as or otherwise support a means for including, associated with a proportion of the first codeword length to the second codeword length, a first quantity of shortening bits in each codeword having the first codeword length and a second quantity of shortening bits in each codeword having the second codeword length, the first quantity of shortening bits being greater than the second quantity of shortening bits. In some examples, the puncturing component 755 may be configured as or otherwise support a means for puncturing, associated with the proportion of the first codeword length to the second codeword length, a first portion of each codeword having the first codeword length and a second portion of each codeword having the second codeword length.

In some examples, the shortening component 750 may be configured as or otherwise support a means for including, associated with a quantity of codewords having the second codeword length, shortening bits in each codeword having the second codeword length and not in any codeword having the first codeword length. In some examples, the puncturing component 755 may be configured as or otherwise support a means for puncturing, associated with the quantity of codewords having the second codeword length, a portion of each codeword having the second codeword length but not any codewords having the first codeword length.

In some examples, the shortening component 750 may be configured as or otherwise support a means for including, associated with a quantity of codewords forming the set of multiple symbols, a first quantity of shortening bits in each codeword having the first codeword length and a second quantity of shortening bits in each codeword having the second codeword length, the first quantity of shortening bits and the second quantity of shortening bits within a threshold difference of shortening bits. In some examples, the puncturing component 755 may be configured as or otherwise support a means for puncturing, associated with the quantity of codewords and the threshold difference, a portion of each codeword having the first codeword length and each codeword having the second codeword length.

In some examples, the shortening component 750 may be configured as or otherwise support a means for including, associated with a quantity of codewords having the first codeword length, shortening bits in each codeword having the first codeword length but not in any codewords having the second codeword length. In some examples, the puncturing component 755 may be configured as or otherwise support a means for puncturing, associated with the quantity of codewords having the first codeword length, a portion of each codeword having the first codeword length but not any codewords having the second codeword length.

In some examples, the shortening component 750 may be configured as or otherwise support a means for including, associated with a first quantity of codewords having the second codeword length, shortening bits in each codeword having the second codeword length but not any codewords having the first codeword length. In some examples, the puncturing component 755 may be configured as or otherwise support a means for puncturing, associated with a second quantity of codewords having the first codeword length, a portion of each codeword having the first codeword length but not any codewords having the second codeword length.

In some examples, to support performing the LDPC coding operation, the encoding component 760 may be configured as or otherwise support a means for encoding a first portion of the set of multiple input bits using a first code rate to generate the one or more codewords having the first codeword length. In some examples, to support performing the LDPC coding operation, the encoding component 760 may be configured as or otherwise support a means for encoding a second portion of the set of multiple input bits using a second code rate, that is less than the first code rate, to generate the one or more codewords having the second codeword length.

In some examples, to support transmitting the set of multiple symbols, the symbol transmission component 735 may be configured as or otherwise support a means for transmitting, associated with refraining from puncturing the set of multiple codewords, a packet that includes the set of multiple symbols and a header indicating a quantity of additional symbols in the packet.

In some examples, the codeword length selection component 765 may be configured as or otherwise support a means for selecting, associated with a quantity of the input bits satisfying a threshold, the first codeword length and the second codeword length.

In some examples, the codeword length selection component 765 may be configured as or otherwise support a means for calculating a quantity of coded bits to be carried in the last symbol, a quantity of assigned symbols for the set of multiple symbols, and a quantity of available coded bits associated with a quantity of the input bits, an RU size, a modulation and coding scheme, a symbol boundary for the last symbol, or any combination thereof.

In some examples, the codeword length selection component 765 may be configured as or otherwise support a means for selecting the second codeword length, the second codeword length associated with the quantity of coded bits to be carried in the last symbol, the quantity of assigned symbols for the set of multiple symbols, and the quantity of available coded bits.

In some examples, the codeword length selection component 765 may be configured as or otherwise support a means for selecting, associated with a difference between the quantity of available coded bits and the second codeword length, the first codeword length.

In some examples, the codeword length selection component 765 may be configured as or otherwise support a means for selecting the first codeword length associated with a difference between a total quantity of coded blocks that are to be used to transmit the set of multiple symbols and a sub-quantity of coded blocks that are to be transmitted in the last symbol.

Additionally, or alternatively, the communications manager 720 may support wireless communications at a first wireless device in accordance with examples as disclosed herein. In some examples, the LDPC coding component 725 may be configured as or otherwise support a means for performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. In some examples, the codeword arranging component 730 may be configured as or otherwise support a means for arranging the one or more codewords into a set of multiple symbols including one or more padded symbols after a forward error correction. In some examples, the symbol transmission component 735 may be configured as or otherwise support a means for transmitting, to a second wireless device via the RU, the set of multiple symbols with a header indicating a quantity of the one or more padded symbols.

In some examples, to support arranging the one or more codewords, the symbol padding component 770 may be configured as or otherwise support a means for padding the set of multiple symbols with a first quantity of symbols associated with a size of the RU satisfying a threshold or a second quantity of symbols associated with the size of the RU failing to satisfy the threshold. In some examples, a quantity of symbols for padding the set of multiple symbols is associated with a quantity of coded bits per symbol. In some examples, the codeword length is greater 1944 bits.

Additionally, or alternatively, the communications manager 720 may support wireless communications at a second wireless device in accordance with examples as disclosed herein. The symbol reception component 740 may be configured as or otherwise support a means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The decoding component 745 may be configured as or otherwise support a means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain the set of multiple input bits.

In some examples, to support decoding the set of multiple symbols, the decoding component 745 may be configured as or otherwise support a means for decoding, associated with a first quantity of shortening bits in the one or more codewords having the first codeword length and a second quantity of shortening bits having the second codeword length, the one or more codewords having the first codeword length and the one or more codewords having the second codeword length, the first quantity of shortening bits being in proportion to the second quantity of shortening bits associated with a proportion of the first codeword length to the second codeword length. In some examples, to support decoding the set of multiple symbols, the decoding component 745 may be configured as or otherwise support a means for decoding, associated with the one or more codewords having the first codeword length and the one or more codewords having the second codeword length being punctured in proportion of the first codeword length to the second codeword length, the one or more codewords having the first codeword length and the one or more codewords having the second codeword length.

In some examples, to support decoding the set of multiple symbols, the decoding component 745 may be configured as or otherwise support a means for decoding, associated with the one or more codewords having the second codeword length including shortening bits and the one or more codewords having the first codeword length including no shortening bits, the one or more codewords having the first codeword length and the one or more codewords having the second codeword length. In some examples, to support decoding the set of multiple symbols, the decoding component 745 may be configured as or otherwise support a means for decoding, associated with the one or more codewords having the second codeword length being punctured and the one or more codewords having the first codeword length not being punctured, the one or more codewords having the first codeword length and the one or more codewords having the second codeword length.

In some examples, to support decoding the set of multiple symbols, the decoding component 745 may be configured as or otherwise support a means for decoding, associated with a first quantity of shortening bits in the one or more codewords having the first codeword length and a second quantity of shortening bits in the one or more codewords having the second codeword length, the one or more codewords having the first codeword length and the one or more codewords having the second codeword length, the first quantity of shortening bits and the second quantity of shortening bits being within a threshold difference. In some examples, to support decoding the set of multiple symbols, the decoding component 745 may be configured as or otherwise support a means for decoding, associated with a first quantity of punctured bits in the one or more codewords having the first codeword length and a second quantity of punctured bits in the one or more codewords having the second codeword length, the one or more codewords having the first codeword length and the one or more codewords having the second codeword length, the first quantity of punctured bits and the second quantity of punctured bits being within the threshold difference.

In some examples, to support decoding the set of multiple symbols, the decoding component 745 may be configured as or otherwise support a means for decoding, associated with shortening bits being included in the one or more codewords having the first codeword length and not being included in the one or more codewords having the second codeword length, the one or more codewords having the first codeword length and the one or more codewords having the second codeword length. In some examples, to support decoding the set of multiple symbols, the decoding component 745 may be configured as or otherwise support a means for decoding, associated with the one or more codewords having the first codeword length being punctured and the one or more codewords having the second codeword length not being punctured, the one or more codewords having the first codeword length and the one or more codewords having the second codeword length.

In some examples, to support decoding the set of multiple symbols, the decoding component 745 may be configured as or otherwise support a means for decoding, associated with shortening bits being included in the one or more codewords having the second codeword length and not being included in the one or more codewords having the first codeword length, the one or more codewords having the second codeword length. In some examples, to support decoding the set of multiple symbols, the decoding component 745 may be configured as or otherwise support a means for decoding, associated with the one or more codewords having the first codeword length being punctured and the one or more codewords having the second codeword length not being punctured, the one or more codewords having the first codeword length.

In some examples, to support decoding the set of multiple symbols, the decoding component 745 may be configured as or otherwise support a means for decoding the one or more codewords having the first codeword length using a first code rate to obtain a first portion of the set of multiple input bits. In some examples, to support decoding the set of multiple symbols, the decoding component 745 may be configured as or otherwise support a means for decoding the one or more codewords having the second codeword length using a second code rate, that is less than the first code rate, to obtain a second portion of the set of multiple input bits.

In some examples, to support receiving the set of multiple symbols, the symbol padding component 770 may be configured as or otherwise support a means for receiving, associated with the set of multiple codewords not being punctured, a packet that includes the set of multiple symbols and a header indicating a quantity of additional symbols in the packet.

Additionally, or alternatively, the communications manager 720 may support wireless communications at a second wireless device in accordance with examples as disclosed herein. In some examples, the symbol reception component 740 may be configured as or otherwise support a means for receiving, from a first wireless device, a set of multiple symbols with a header indicating a quantity of one or more padded symbols included after a forward error correction. In some examples, the decoding component 745 may be configured as or otherwise support a means for decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof.

In some examples, a quantity of symbols for padding the set of multiple symbols is associated with a quantity of coded bits per symbol. In some examples, the codeword length is greater than 1944 bits.

Figure 8:
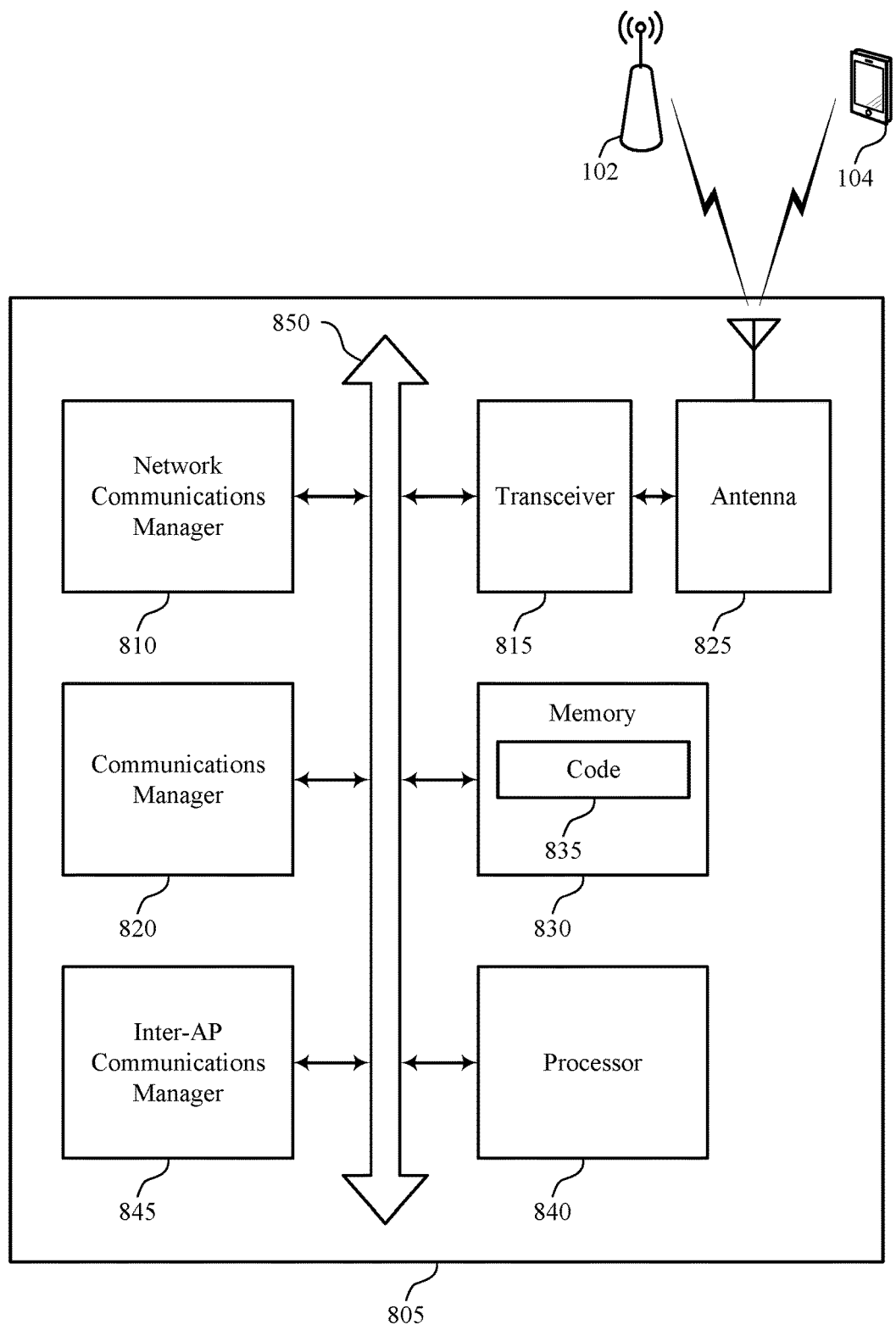
FIG. 8 illustrates a diagram of a system including an AP that supports techniques for generating and using longer LDPC codewords in accordance with one or more aspects of the present disclosure.

FIG. 8 illustrates a diagram of a system including a device 805 that supports techniques for generating and using longer LDPC codewords in accordance with one or more aspects of the present disclosure. The device 805 may be an example of or include the components of a device 505, a device 605, or an AP as described herein. The device 805 may include components for bi-directional voice and data communications including components for transmitting and receiving communications, such as a communications manager 820, a network communications manager 810, a transceiver 815, an antenna 825, a memory 830, code 835, a processor 840, and an inter-AP communications manager 845. These components may be in electronic communication or otherwise coupled (for example, operatively, communicatively, functionally, electronically, electrically) via one or more buses (for example, a bus 850).

The network communications manager 810 may manage communications with a core network (for example, via one or more wired backhaul links). For example, the network communications manager 810 may manage the transfer of data communications for client devices, such as one or more STAs 104.

In some cases, the device 805 may include a single antenna 825. However, in some other cases the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets and provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include RAM and ROM. The memory 830 may store computer-readable, computer-executable code 835 including instructions that, when executed by the processor 840, cause the device 805 to perform various functions described herein. In some cases, the memory 830 may contain, among other things, a BIOS which may control basic hardware or software operation such as the interaction with peripheral components or devices.

The processor 840 may include an intelligent hardware device, (for example, a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (for example, the memory 830) to cause the device 805 to perform various functions (for example, functions or tasks supporting techniques for generating and using longer LDPC codewords). For example, the device 805 or a component of the device 805 may include a processor 840 and memory 830 coupled with or to the processor 840, the processor 840 and memory 830 configured to perform various functions described herein.

The inter-station communications manager 845 may manage communications with other APs 102, and may include a controller or scheduler for controlling communications with STAs 104 in cooperation with other APs 102. For example, the inter-station communications manager 845 may coordinate scheduling for transmissions to APs 102 for various interference mitigation techniques such as beamforming or joint transmission. In some examples, the inter-station communications manager 845 may provide an X2 interface within an LTE/LTE-A wireless communication network technology to provide communication between APs 102.

The communications manager 820 may support wireless communications at a first wireless device in accordance with examples as disclosed herein. For example, the communications manager 820 may be configured as or otherwise support a means for performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The communications manager 820 may be configured as or otherwise support a means for arranging the set of multiple codewords into a set of multiple symbols such that a last symbol in time of the set of multiple symbols includes at least a portion of the one or more codewords each having the second codeword length and no codewords having the first codeword length. The communications manager 820 may be configured as or otherwise support a means for transmitting, to a second wireless device, the set of multiple symbols.

Additionally, or alternatively, the communications manager 820 may support wireless communications at a first wireless device in accordance with examples as disclosed herein. For example, the communications manager 820 may be configured as or otherwise support a means for performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. The communications manager 820 may be configured as or otherwise support a means for arranging the one or more codewords into a set of multiple symbols including one or more padded symbols after a forward error correction. The communications manager 820 may be configured as or otherwise support a means for transmitting, to a second wireless device via the RU, the set of multiple symbols with a header indicating a quantity of the one or more padded symbols.

Additionally, or alternatively, the communications manager 820 may support wireless communications at a second wireless device in accordance with examples as disclosed herein. For example, the communications manager 820 may be configured as or otherwise support a means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The communications manager 820 may be configured as or otherwise support a means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain a set of multiple input bits.

Additionally, or alternatively, the communications manager 820 may support wireless communications at a second wireless device in accordance with examples as disclosed herein. For example, the communications manager 820 may be configured as or otherwise support a means for receiving, from a first wireless device, a set of multiple symbols with a header indicating a quantity of one or more padded symbols included after a forward error correction. The communications manager 820 may be configured as or otherwise support a means for decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof.

By including or configuring the communications manager 820 in accordance with examples as described herein, the device 805 may support techniques for improved communication reliability associated with increased channel gain and reduced puncturing of LDPC codes.

Figure 9:
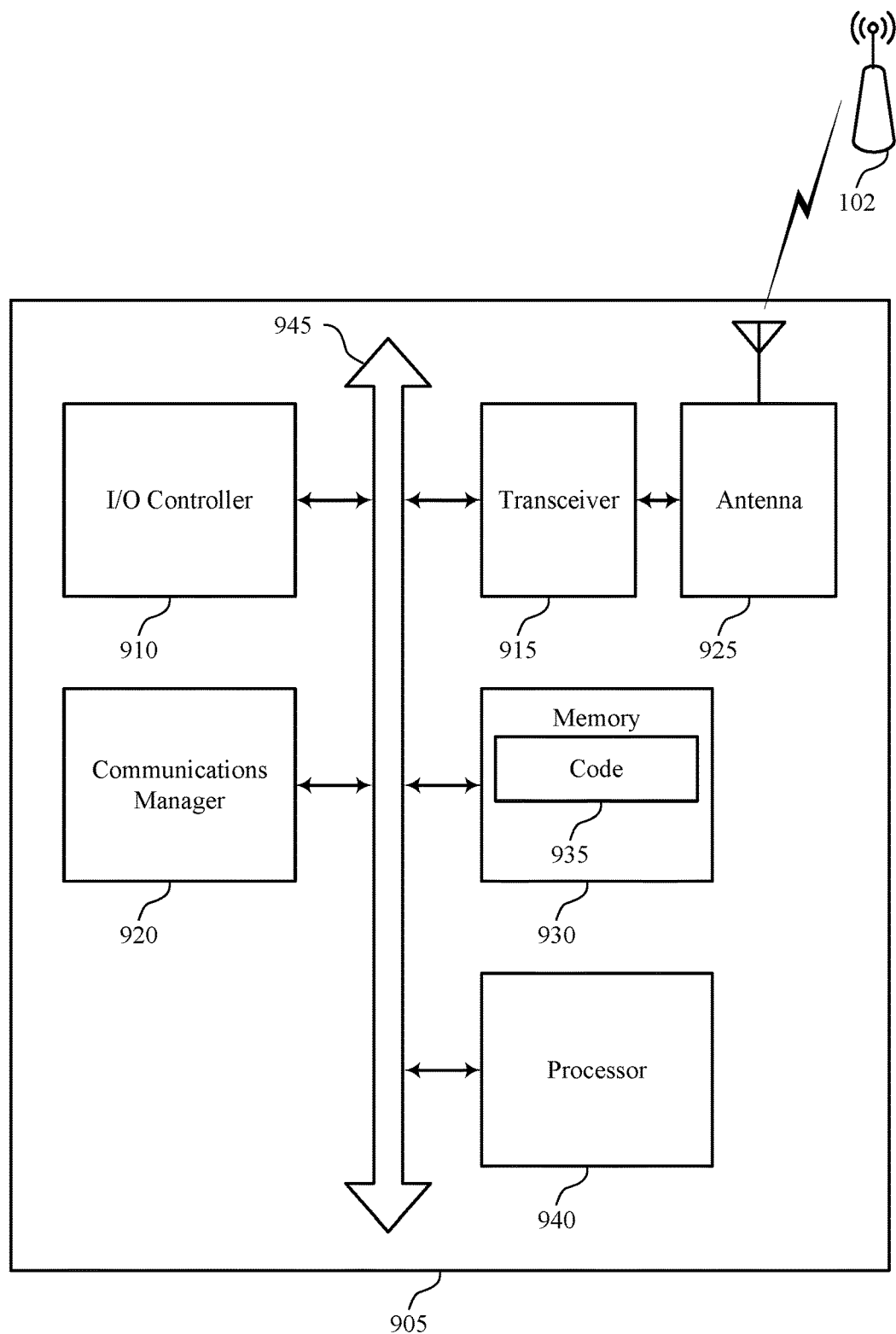
FIG. 9 illustrates a diagram of a system including an STA that supports techniques for generating and using longer LDPC codewords in accordance with one or more aspects of the present disclosure.

FIG. 9 illustrates a diagram of a system including a device 905 that supports techniques for generating and using longer LDPC codewords in accordance with one or more aspects of the present disclosure. The device 905 may be an example of or include the components of a device 505, a device 605, or an STA as described herein. The device 905 may include components for bi-directional voice and data communications including components for transmitting and receiving communications, such as a communications manager 920, an I/O controller 910, a transceiver 915, an antenna 925, a memory 930, code 935, and a processor 940. These components may be in electronic communication or otherwise coupled (for example, operatively, communicatively, functionally, electronically, electrically) via one or more buses (for example, a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. In some other cases, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets and provide the modulated packets to one or more antennas 925 for transmission, and to demodulate packets received from the one or more antennas 925. The transceiver 915, or the transceiver 915 and one or more antennas 925, may be an example of a transmitter 515, a transmitter 615, a receiver 510, a receiver 610, or any combination thereof or component thereof, as described herein.

The memory 930 may include RAM and ROM. The memory 930 may store computer-readable, computer-executable code 935 including instructions that, when executed by the processor 940, cause the device 905 to perform various functions described herein. In some cases, the memory 930 may contain, among other things, a BIOS which may control basic hardware or software operation such as the interaction with peripheral components or devices.

The processor 940 may include an intelligent hardware device, (for example, a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (for example, the memory 930) to cause the device 905 to perform various functions (for example, functions or tasks supporting techniques for generating and using longer LDPC codewords). For example, the device 905 or a component of the device 905 may include a processor 940 and memory 930 coupled with or to the processor 940, the processor 940 and memory 930 configured to perform various functions described herein.

The communications manager 920 may support wireless communications at a first wireless device in accordance with examples as disclosed herein. For example, the communications manager 920 may be configured as or otherwise support a means for performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The communications manager 920 may be configured as or otherwise support a means for arranging the set of multiple codewords into a set of multiple symbols such that a last symbol in time of the set of multiple symbols includes at least a portion of the one or more codewords each having the second codeword length and no codewords having the first codeword length. The communications manager 920 may be configured as or otherwise support a means for transmitting, to a second wireless device, the set of multiple symbols.

Additionally, or alternatively, the communications manager 920 may support wireless communications at a first wireless device in accordance with examples as disclosed herein. For example, the communications manager 920 may be configured as or otherwise support a means for performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. The communications manager 920 may be configured as or otherwise support a means for arranging the one or more codewords into a set of multiple symbols including one or more padded symbols after a forward error correction. The communications manager 920 may be configured as or otherwise support a means for transmitting, to a second wireless device via the RU, the set of multiple symbols with a header indicating a quantity of the one or more padded symbols.

Additionally, or alternatively, the communications manager 920 may support wireless communications at a second wireless device in accordance with examples as disclosed herein. For example, the communications manager 920 may be configured as or otherwise support a means for receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The communications manager 920 may be configured as or otherwise support a means for decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain a set of multiple input bits.

Additionally, or alternatively, the communications manager 920 may support wireless communications at a second wireless device in accordance with examples as disclosed herein. For example, the communications manager 920 may be configured as or otherwise support a means for receiving, from a first wireless device, a set of multiple symbols with a header indicating a quantity of one or more padded symbols included after a forward error correction. The communications manager 920 may be configured as or otherwise support a means for decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof.

By including or configuring the communications manager 920 in accordance with examples as described herein, the device 905 may support techniques improved communication reliability due to reduced puncturing of LDPC codes and increased gain.

Figure 10:
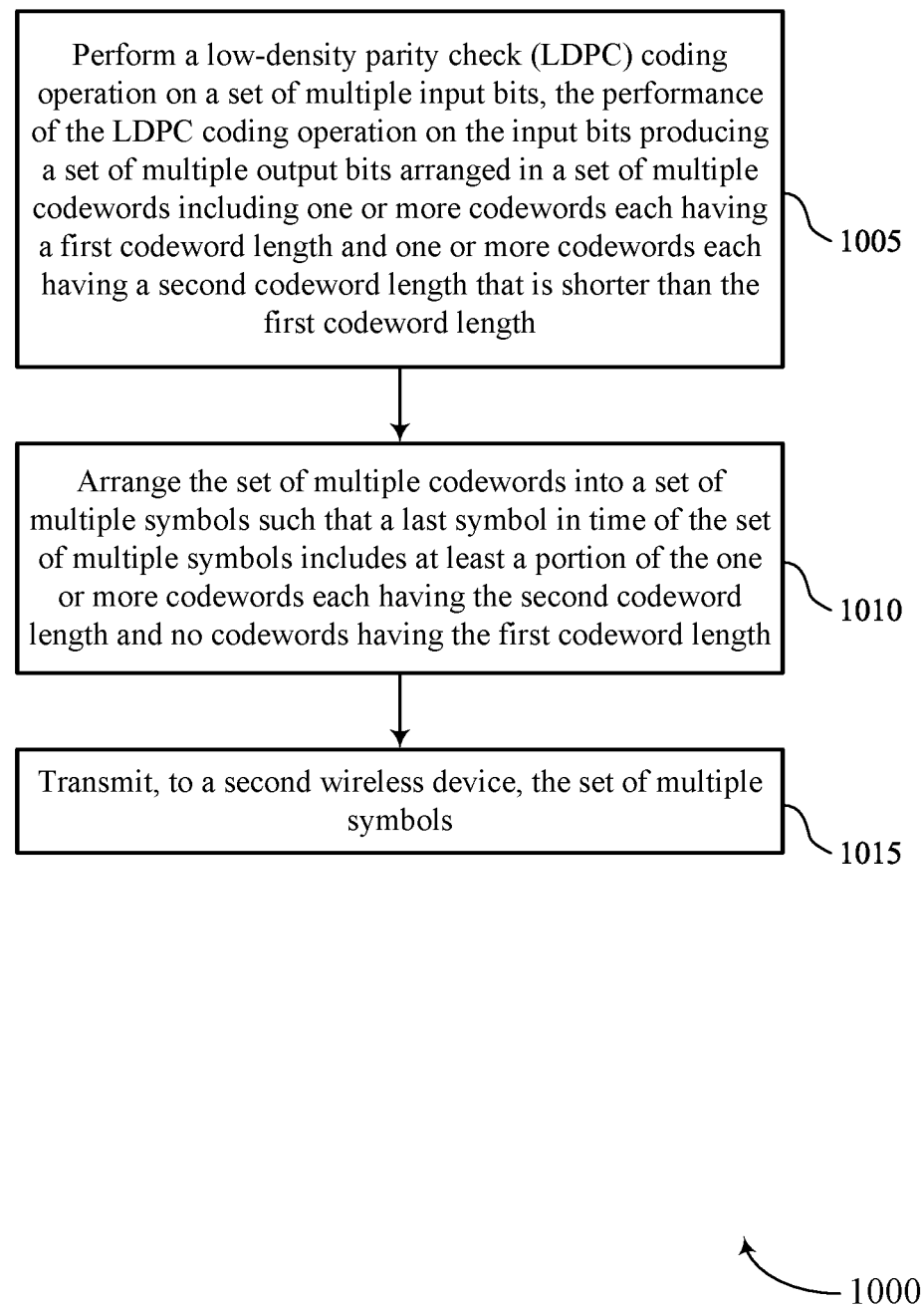
FIGS. 10-13 illustrate flowcharts showing methods that support techniques for generating and using longer LDPC codewords in accordance with one or more aspects of the present disclosure.

FIG. 10 illustrates a flowchart showing a method 1000 that supports techniques for generating and using longer LDPC codewords in accordance with one or more aspects of the present disclosure. The operations of the method 1000 may be implemented by an AP or an STA or its components as described herein. For example, the operations of the method 1000 may be performed by an AP or an STA as described with reference to FIGS. 1-9. In some examples, an AP or an STA may execute a set of instructions to control the functional elements of the AP or the STA to perform the described functions. Additionally, or alternatively, the AP or the STA may perform aspects of the described functions using special-purpose hardware.

At 1005, the method may include performing an LDPC coding operation on a set of multiple input bits, the performance of the LDPC coding operation on the input bits producing a set of multiple output bits arranged in a set of multiple codewords including one or more codewords each having a first codeword length and one or more codewords each having a second codeword length that is shorter than the first codeword length. The operations of 1005 may be performed in accordance with examples as disclosed herein. In some examples, aspects of the operations of 1005 may be performed by an LDPC coding component 725 as described with reference to FIG. 7.

At 1010, the method may include arranging the set of multiple codewords into a set of multiple symbols such that a last symbol in time of the set of multiple symbols includes at least a portion of the one or more codewords each having the second codeword length and no codewords having the first codeword length. The operations of 1010 may be performed in accordance with examples as disclosed herein. In some examples, aspects of the operations of 1010 may be performed by a codeword arranging component 730 as described with reference to FIG. 7.

At 1015, the method may include transmitting, to a second wireless device, the set of multiple symbols. The operations of 1015 may be performed in accordance with examples as disclosed herein. In some examples, aspects of the operations of 1015 may be performed by a symbol transmission component 735 as described with reference to FIG. 7.

Figure 11:
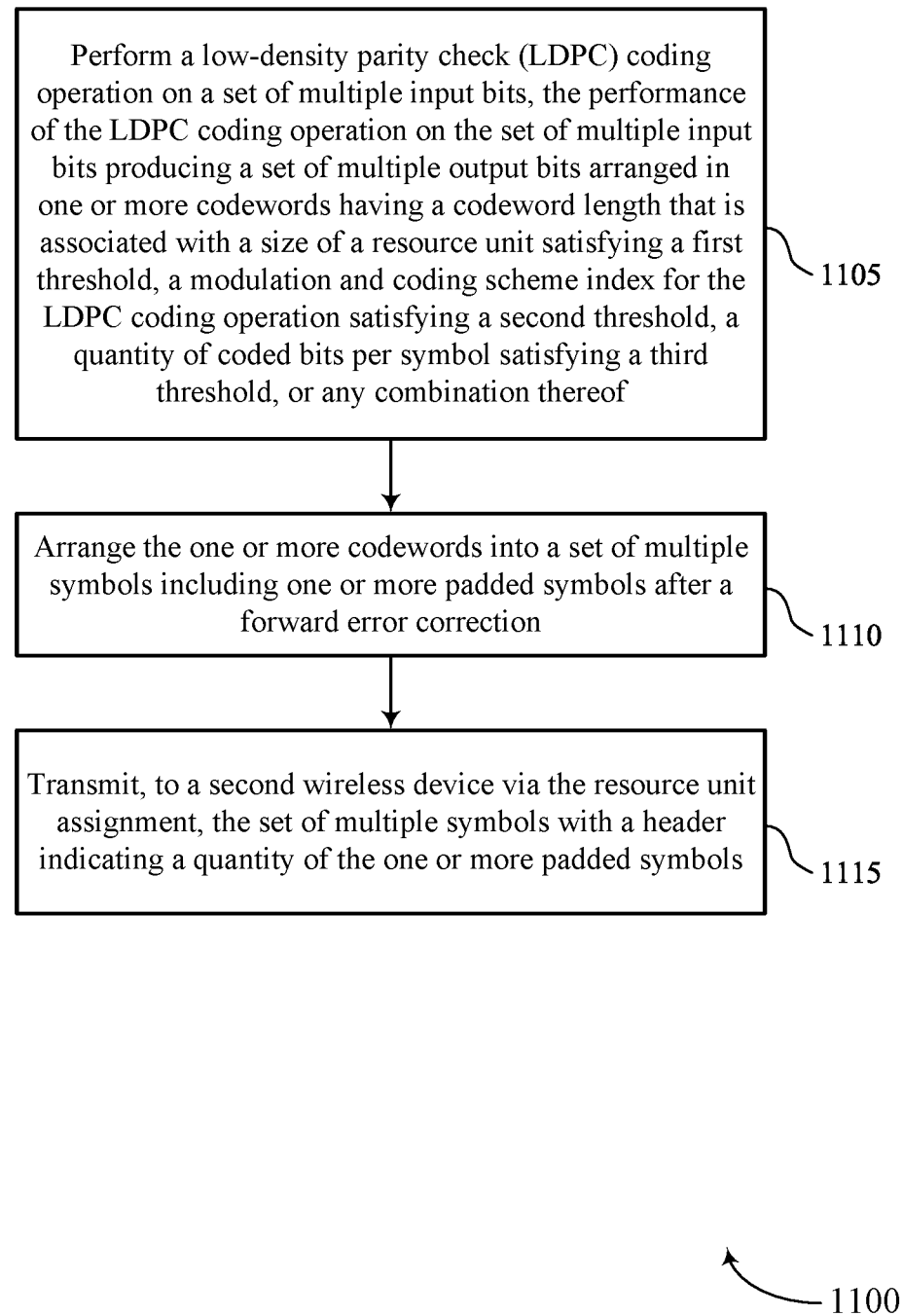

FIG. 11 illustrates a flowchart showing a method 1100 that supports techniques for generating and using longer LDPC codewords in accordance with one or more aspects of the present disclosure. The operations of the method 1100 may be implemented by an AP or an STA or its components as described herein. For example, the operations of the method 1100 may be performed by an AP or an STA as described with reference to FIGS. 1-9. In some examples, an AP or an STA may execute a set of instructions to control the functional elements of the AP or the STA to perform the described functions. Additionally, or alternatively, the AP or the STA may perform aspects of the described functions using special-purpose hardware.

At 1105, the method may include performing an LDPC coding operation on a set of multiple input bits, the performance of the LDPC coding operation on the input bits producing a set of multiple output bits arranged in one or more codewords having a codeword length that is associated with a size of an RU satisfying a first threshold, a modulation and coding scheme index for the LDPC coding operation satisfying a second threshold, a quantity of coded bits per symbol satisfying a third threshold, or any combination thereof. The operations of 1105 may be performed in accordance with examples as disclosed herein. In some examples, aspects of the operations of 1105 may be performed by an LDPC coding component 725 as described with reference to FIG. 7.

At 1110, the method may include arranging the one or more codewords into a set of multiple symbols including one or more padded symbols after a forward error correction. The operations of 1110 may be performed in accordance with examples as disclosed herein. In some examples, aspects of the operations of 1110 may be performed by a codeword arranging component 730 as described with reference to FIG. 7.

At 1115, the method may include transmitting, to a second wireless device via the RU, the set of multiple symbols with a header indicating a quantity of the one or more padded symbols. The operations of 1115 may be performed in accordance with examples as disclosed herein. In some examples, aspects of the operations of 1115 may be performed by a symbol transmission component 735 as described with reference to FIG. 7.

Figure 12:
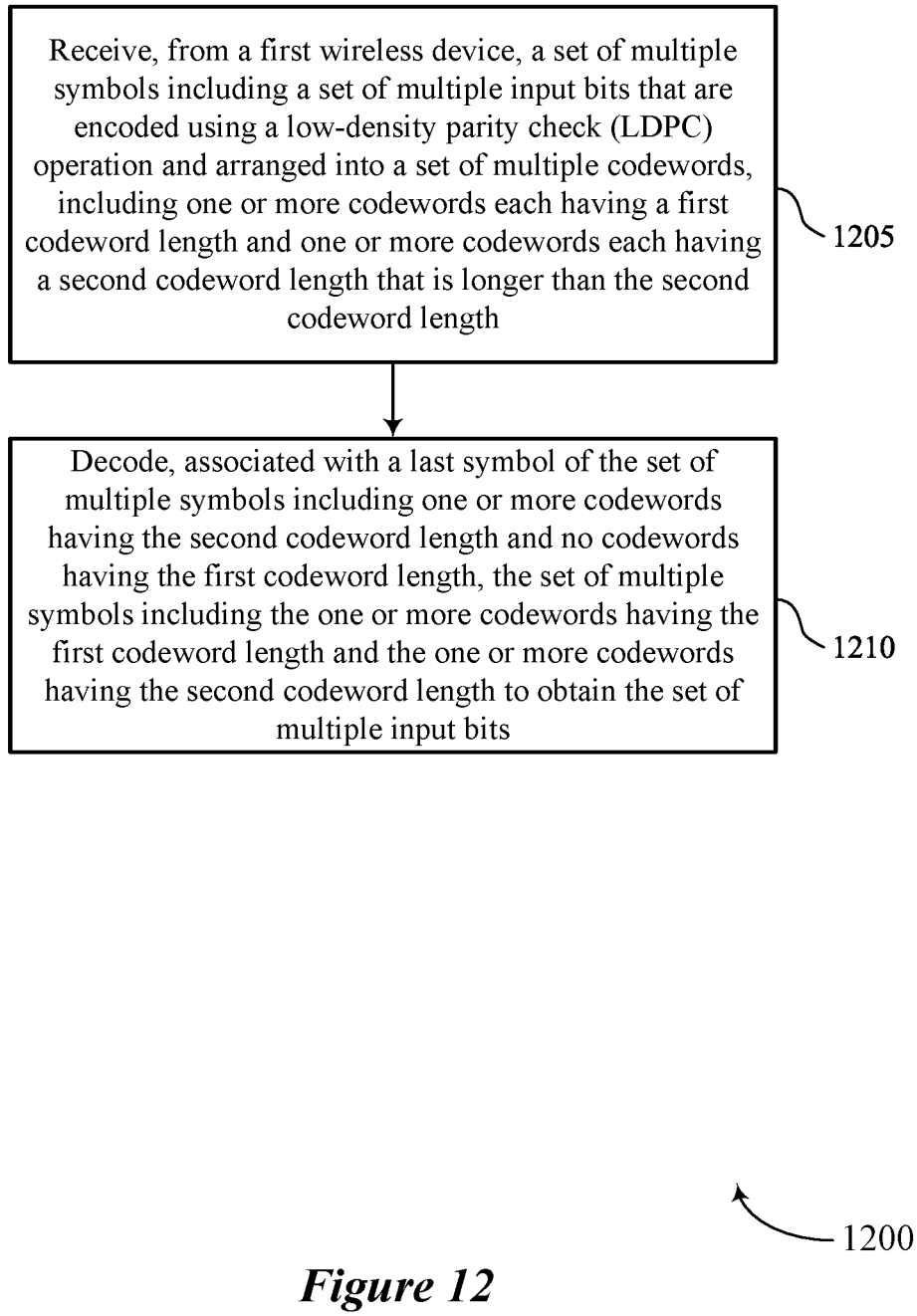

FIG. 12 illustrates a flowchart showing a method 1200 that supports techniques for generating and using longer LDPC codewords in accordance with one or more aspects of the present disclosure. The operations of the method 1200 may be implemented by an AP or an STA or its components as described herein. For example, the operations of the method 1200 may be performed by an AP or an STA as described with reference to FIGS. 1-9. In some examples, an AP or an STA may execute a set of instructions to control the functional elements of the AP or the STA to perform the described functions. Additionally, or alternatively, the AP or the STA may perform aspects of the described functions using special-purpose hardware.

At 1205, the method may include receiving, from a first wireless device, a set of multiple symbols including a set of multiple input bits that are encoded using an LDPC operation and arranged into a set of multiple codewords, including one or more codewords each having a first codeword length and one or more codewords each having a second codeword length that is longer than the second codeword length. The operations of 1205 may be performed in accordance with examples as disclosed herein. In some examples, aspects of the operations of 1205 may be performed by a symbol reception component 740 as described with reference to FIG. 7.

At 1210, the method may include decoding, associated with a last symbol of the set of multiple symbols including one or more codewords having the second codeword length and no codewords having the first codeword length, the set of multiple symbols including the one or more codewords having the first codeword length and the one or more codewords having the second codeword length to obtain a set of multiple input bits. The operations of 1210 may be performed in accordance with examples as disclosed herein. In some examples, aspects of the operations of 1210 may be performed by a decoding component 745 as described with reference to FIG. 7.

Figure 13:
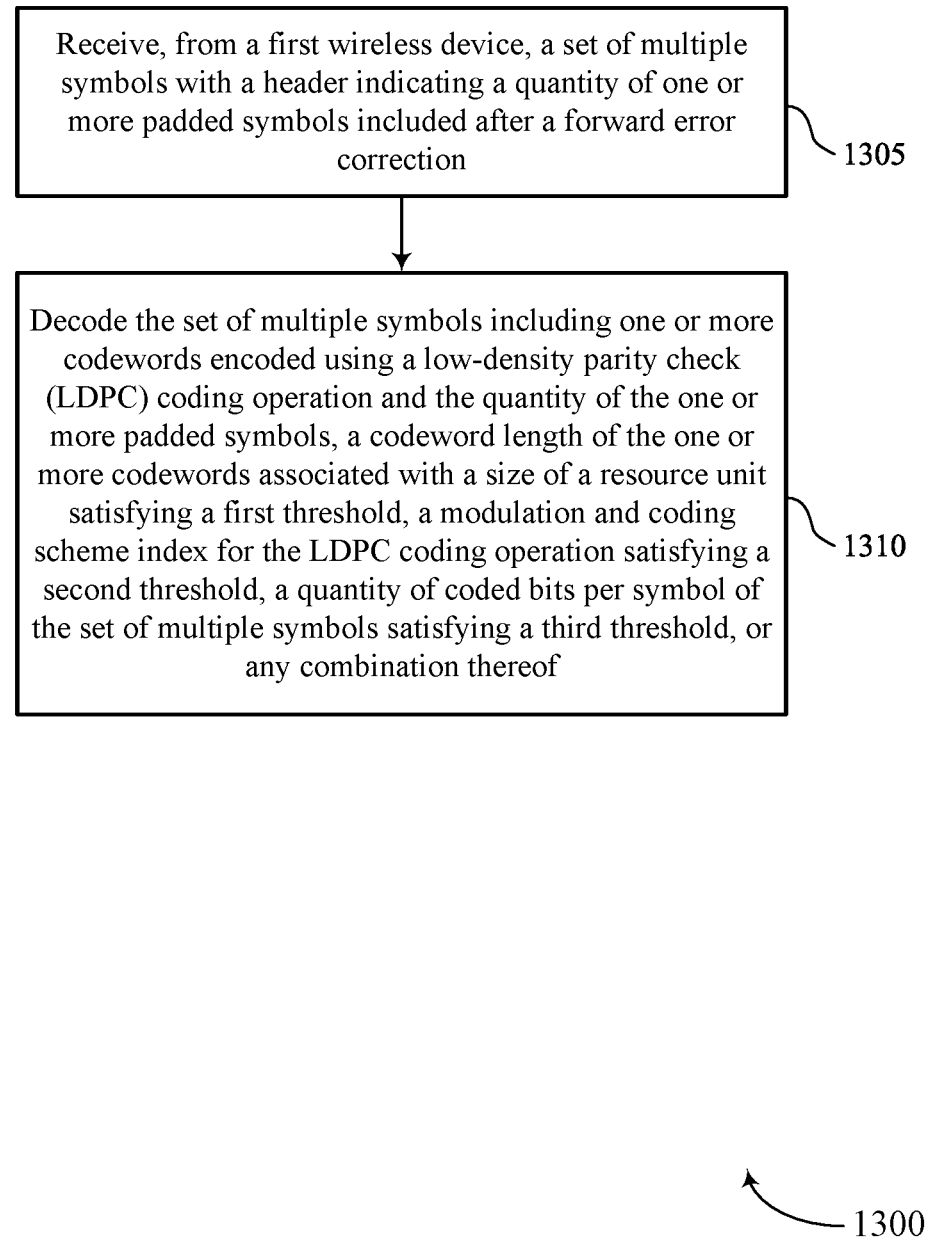

FIG. 13 illustrates a flowchart showing a method 1300 that supports techniques for generating and using longer LDPC codewords in accordance with one or more aspects of the present disclosure. The operations of the method 1300 may be implemented by an AP or an STA or its components as described herein. For example, the operations of the method 1300 may be performed by an AP or an STA as described with reference to FIGS. 1-9. In some examples, an AP or an STA may execute a set of instructions to control the functional elements of the AP or the STA to perform the described functions. Additionally, or alternatively, the AP or the STA may perform aspects of the described functions using special-purpose hardware.

At 1305, the method may include receiving, from a first wireless device, a set of multiple symbols with a header indicating a quantity of one or more padded symbols included after a forward error correction. The operations of 1305 may be performed in accordance with examples as disclosed herein. In some examples, aspects of the operations of 1305 may be performed by a symbol reception component 740 as described with reference to FIG. 7.

At 1310, the method may include decoding the set of multiple symbols including one or more codewords encoded using an LDPC coding operation and the quantity of the one or more padded symbols, a codeword length of the one or more codewords associated with a size of an RU satisfying a first threshold, a modulation and coding scheme index for the LDPC coding operation satisfying a second threshold, a quantity of coded bits per symbol of the set of multiple symbols satisfying a third threshold, or any combination thereof. The operations of 1310 may be performed in accordance with examples as disclosed herein. In some examples, aspects of the operations of 1310 may be performed by a decoding component 745 as described with reference to FIG. 7.

It should be noted that the methods described herein describe possible implementations, and that the operations and the steps may be rearranged or otherwise modified and that other implementations are possible. Furthermore, aspects from two or more of the methods may be combined.

The following provides an overview of aspects of the present disclosure:

Aspect 1: A method for wireless communications at a first wireless device, comprising: performing a low-density parity check (LDPC) coding operation on a plurality of input bits, the performance of the LDPC coding operation on the plurality of input bits producing a plurality of output bits arranged in a plurality of codewords including one or more codewords each having a first codeword length and one or more codewords each having a second codeword length that is shorter than the first codeword length; arranging the plurality of codewords into a plurality of symbols such that a last symbol in time of the plurality of symbols includes at least a portion of the one or more codewords having the second codeword length and no codewords having the first codeword length; and transmitting, to a second wireless device, the plurality of symbols.

Aspect 2: The method of aspect 1, further comprising: including, associated with a proportion of the first codeword length to the second codeword length, a first quantity of shortening bits in each codeword having the first codeword length and a second quantity of shortening bits in each codeword having the second codeword length, the first quantity of shortening bits being greater than the second quantity of shortening bits; and puncturing, associated with the proportion of the first codeword length to the second codeword length, a first portion of each codeword having the first codeword length and a second portion of each codeword having the second codeword length.

Aspect 3: The method of any of aspects 1 through 2, further comprising: including, associated with a quantity of codewords having the second codeword length, shortening bits in each codeword having the second codeword length and not in any codeword having the first codeword length; and puncturing, associated with the quantity of codewords having the second codeword length, a portion of each codeword having the second codeword length but not any codewords having the first codeword length.

Aspect 4: The method of any of aspects 1 through 3, further comprising: including, associated with a quantity of codewords forming the plurality of symbols, a first quantity of shortening bits in each codeword having the first codeword length and a second quantity of shortening bits in each codeword having the second codeword length, the first quantity of shortening bits and the second quantity of shortening bits within a threshold difference of shortening bits; and puncturing, associated with the quantity of codewords and the threshold difference, a portion of each codeword having the first codeword length and each codeword having the second codeword length.

Aspect 5: The method of any of aspects 1 through 4, further comprising: including, associated with a quantity of codewords having the first codeword length, shortening bits in each codeword having the first codeword length but not in any codewords having the second codeword length; and puncturing, associated with the quantity of codewords having the first codeword length, a portion of each codeword having the first codeword length but not any codewords having the second codeword length.

Aspect 6: The method of any of aspects 1 through 5, further comprising: including, associated with a first quantity of codewords having the second codeword length, shortening bits in each codeword having the second codeword length but not any codewords having the first codeword length; and puncturing, associated with a second quantity of codewords having the first codeword length, a portion of each codeword having the first codeword length but not any codewords having the second codeword length.

Aspect 7: The method of any of aspects 1 through 6, wherein performing the LDPC coding operation comprises: encoding a first portion of the plurality of input bits using a first code rate to generate the one or more codewords having the first codeword length; and encoding a second portion of the plurality of input bits using a second code rate, that is less than the first code rate, to generate the one or more codewords having the second codeword length.

Aspect 8: The method of any of aspects 1 through 7, wherein transmitting the plurality of symbols comprises: transmitting, associated with refraining from puncturing the plurality of codewords, a packet that includes the plurality of symbols and a header indicating a quantity of additional symbols in the packet.

Aspect 9: The method of any of aspects 1 through 8, further comprising: selecting, associated with a quantity of the plurality of input bits satisfying a threshold, the first codeword length and the second codeword length.

Aspect 10: The method of any of aspects 1 through 9, further comprising: calculating a quantity of coded bits to be carried in the last symbol, a quantity of assigned symbols for the plurality of symbols, and a quantity of available coded bits based at least in part on a quantity of the plurality of input bits, a resource unit size, a modulation and coding scheme, a symbol boundary for the last symbol, or any combination thereof.

Aspect 11: The method of aspect 10, further comprising: selecting the second codeword length, the second codeword length associated with the quantity of coded bits to be carried in the last symbol, the quantity of assigned symbols for the plurality of symbols, and the quantity of available coded bits.

Aspect 12: The method of aspect 11, further comprising: selecting, associated with a difference between the quantity of available coded bits and the second codeword length, the first codeword length.

Aspect 13: The method of any of aspects 1 through 12, further comprising: selecting the first codeword length based at least in part on a difference between a total quantity of coded blocks that are to be used to transmit the plurality of symbols and a sub-quantity of coded blocks that are to be transmitted in the last symbol.

Aspect 14: A method for wireless communications at a first wireless device, comprising: performing a low-density parity check (LDPC) coding operation on a plurality of input bits, the performance of the LDPC coding operation on the plurality of input bits producing a plurality of output bits arranged in one or more codewords having a codeword length that is associated with a size of a resource unit satisfying a first threshold, a modulation and coding scheme index for the LDPC coding operation satisfying a second threshold, a quantity of coded bits per symbol satisfying a third threshold, or any combination thereof; arranging the one or more codewords into a plurality of symbols including one or more padded symbols after a forward error correction; and transmitting, to a second wireless device via the resource unit, the plurality of symbols with a header indicating a quantity of the one or more padded symbols.

Aspect 15: The method of aspect 14, wherein arranging the one or more codewords comprises: padding the plurality of symbols with a first quantity of symbols associated with a size of the resource unit satisfying a threshold or a second quantity of symbols associated with the size of the resource unit failing to satisfy the threshold.

Aspect 16: The method of any of aspects 14 through 15, wherein a quantity of symbols for padding the plurality of symbols is associated with a quantity of coded bits per symbol.

Aspect 17: The method of any of aspects 14 through 16, wherein the codeword length is greater 1944 bits.

Aspect 18: A method for wireless communications at a second wireless device, comprising: receiving, from a first wireless device, a plurality of symbols including a plurality of input bits that are encoded using a low-density parity check (LDPC) operation and arranged into a plurality of codewords, including one or more codewords each having a first codeword length and one or more codewords each having a second codeword length that is longer than the second codeword length; and decoding, associated with a last symbol of the plurality of symbols including one or more codewords having the second codeword length and no codewords having the first codeword length, the plurality of symbols including the one or more codewords having the first codeword length and the one or more codewords having the second codeword length to obtain the plurality of input bits.

Aspect 19: The method of aspect 18, wherein decoding the plurality of symbols comprises: decoding, associated with a first quantity of shortening bits in the one or more codewords having the first codeword length and a second quantity of shortening bits having the second codeword length, the one or more codewords having the first codeword length and the one or more codewords having the second codeword length, the first quantity of shortening bits being in proportion to the second quantity of shortening bits associated with a proportion of the first codeword length to the second codeword length; and decoding, associated with the one or more codewords having the first codeword length and the one or more codewords having the second codeword length being punctured in proportion of the first codeword length to the second codeword length, the one or more codewords having the first codeword length and the one or more codewords having the second codeword length.

Aspect 20: The method of any of aspects 18 through 19, wherein decoding the plurality of symbols comprises: decoding, associated with the one or more codewords having the second codeword length including shortening bits and the one or more codewords having the first codeword length including no shortening bits, the one or more codewords having the first codeword length and the one or more codewords having the second codeword length; and decoding, associated with the one or more codewords having the second codeword length being punctured and the one or more codewords having the first codeword length not being punctured, the one or more codewords having the first codeword length and the one or more codewords having the second codeword length.

Aspect 21: The method of any of aspects 18 through 20, wherein decoding the plurality of symbols comprises: decoding, associated with a first quantity of shortening bits in the one or more codewords having the first codeword length and a second quantity of shortening bits in the one or more codewords having the second codeword length, the one or more codewords having the first codeword length and the one or more codewords having the second codeword length, the first quantity of shortening bits and the second quantity of shortening bits being within a threshold difference; and decoding, associated with a first quantity of punctured bits in the one or more codewords having the first codeword length and a second quantity of punctured bits in the one or more codewords having the second codeword length, the one or more codewords having the first codeword length and the one or more codewords having the second codeword length, the first quantity of punctured bits and the second quantity of punctured bits being within the threshold difference.

Aspect 22: The method of any of aspects 18 through 21, wherein decoding the plurality of symbols comprises: decoding, associated with shortening bits being included in the one or more codewords having the first codeword length and not being included in the one or more codewords having the second codeword length, the one or more codewords having the first codeword length and the one or more codewords having the second codeword length; and decoding, associated with the one or more codewords having the first codeword length being punctured and the one or more codewords having the second codeword length not being punctured, the one or more codewords having the first codeword length and the one or more codewords having the second codeword length.

Aspect 23: The method of any of aspects 18 through 22, wherein decoding the plurality of symbols comprises: decoding, associated with shortening bits being included in the one or more codewords having the second codeword length and not being included in the one or more codewords having the first codeword length, the one or more codewords having the second codeword length; and decoding, associated with the one or more codewords having the first codeword length being punctured and the one or more codewords having the second codeword length not being punctured, the one or more codewords having the first codeword length.

Aspect 24: The method of any of aspects 18 through 23, wherein decoding the plurality of symbols comprises: decoding the one or more codewords having the first codeword length using a first code rate to obtain a first portion of the plurality of input bits; and decoding the one or more codewords having the second codeword length using a second code rate, that is less than the first code rate, to obtain a second portion of the plurality of input bits.

Aspect 25: The method of any of aspects 18 through 24, wherein receiving the plurality of symbols comprises: receiving, associated with the plurality of codewords not being punctured, a packet that includes the plurality of symbols and a header indicating a quantity of additional symbols in the packet.

Aspect 26: A method for wireless communications at a second wireless device, comprising: receiving, from a first wireless device, a plurality of symbols with a header indicating a quantity of one or more padded symbols included after a forward error correction; and decoding the plurality of symbols including one or more codewords encoded using a low-density parity check (LDPC) coding operation and the quantity of the one or more padded symbols, a codeword length of the one or more codewords associated with a size of a resource unit satisfying a first threshold, a modulation and coding scheme index for the LDPC coding operation satisfying a second threshold, a quantity of coded bits per symbol of the plurality of symbols satisfying a third threshold, or any combination thereof.

Aspect 27: The method of aspect 26, wherein a quantity of symbols for padding the plurality of symbols is associated with a quantity of coded bits per symbol.

Aspect 28: The method of any of aspects 26 through 27, wherein the codeword length is greater than 1944 bits.

Aspect 29: An apparatus for wireless communications at a first wireless device, comprising a processor; and memory coupled with the processor and storing instructions executable by the processor to cause the apparatus to perform a method of any of aspects 1 through 13.

Aspect 30: An apparatus for wireless communications at a first wireless device, comprising at least one means for performing a method of any of aspects 1 through 13.

Aspect 31: A non-transitory computer-readable medium storing code for wireless communications at a first wireless device, the code comprising instructions executable by a processor to perform a method of any of aspects 1 through 13.

Aspect 32: An apparatus for wireless communications at a first wireless device, comprising a processor; and memory coupled with the processor and storing instructions executable by the processor to cause the apparatus to perform a method of any of aspects 14 through 17.

Aspect 33: An apparatus for wireless communications at a first wireless device, comprising at least one means for performing a method of any of aspects 14 through 17.

Aspect 34: A non-transitory computer-readable medium storing code for wireless communications at a first wireless device, the code comprising instructions executable by a processor to perform a method of any of aspects 14 through 17.

Aspect 35: An apparatus for wireless communications at a second wireless device, comprising a processor; and memory coupled with the processor and storing instructions executable by the processor to cause the apparatus to perform a method of any of aspects 18 through 25.

Aspect 36: An apparatus for wireless communications at a second wireless device, comprising at least one means for performing a method of any of aspects 18 through 25.

Aspect 37: A non-transitory computer-readable medium storing code for wireless communications at a second wireless device, the code comprising instructions executable by a processor to perform a method of any of aspects 18 through 25.

Aspect 38: An apparatus for wireless communications at a second wireless device, comprising a processor; and memory coupled with the processor and storing instructions executable by the processor to cause the apparatus to perform a method of any of aspects 26 through 28.

Aspect 39: An apparatus for wireless communications at a second wireless device, comprising at least one means for performing a method of any of aspects 26 through 28.

Aspect 40: A non-transitory computer-readable medium storing code for wireless communications at a second wireless device, the code comprising instructions executable by a processor to perform a method of any of aspects 26 through 28.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM). An orthogonal frequency division multiple access (OFDMA) system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc.

The wireless communications system or systems described herein may support synchronous or asynchronous operation. For synchronous operation, the stations may have similar frame timing, and transmissions from different stations may be approximately aligned in time. For asynchronous operation, the stations may have different frame timing, and transmissions from different stations may not be aligned in time. The techniques described herein may be used for either synchronous or asynchronous operations.

The downlink transmissions described herein may also be called forward link transmissions while the uplink transmissions may also be called reverse link transmissions. Each communication link described herein-including, for example, wireless communication network 100 and wireless communications system 200 of FIGS. 1 and 2—may include one or more carriers, where each carrier may be a signal made up of multiple sub-carriers (for example, waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (for example, a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (that is, A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus for wireless communications at a first wireless device, comprising:
    at least one processor; and
    at least one memory coupled with the at least one processor and storing instructions executable by the at least one processor to cause the apparatus to:
        perform a low-density parity check coding operation on a plurality of input bits, the performance of the low-density parity check coding operation on the plurality of input bits producing a plurality of output bits arranged in a plurality of codewords including one or more codewords each having a first codeword length and one or more codewords each having a second codeword length that is shorter than the first codeword length, the first codeword length being a multiple of the second codeword length and longer than 1944 bits;
        arrange the plurality of codewords into a plurality of symbols such that a last symbol in time of the plurality of symbols includes at least a portion of the one or more codewords having the second codeword length and no codewords having the first codeword length; and
        transmit, to a second wireless device, the plurality of symbols.

2. The apparatus of claim 1, wherein the instructions are further executable by the at least one processor to cause the apparatus to:
    include, associated with a proportion of the first codeword length to the second codeword length, a first quantity of shortening bits in each codeword having the first codeword length and a second quantity of shortening bits in each codeword having the second codeword length, the first quantity of shortening bits being greater than the second quantity of shortening bits; and
    puncture, associated with the proportion of the first codeword length to the second codeword length, a first portion of each codeword having the first codeword length and a second portion of each codeword having the second codeword length.

3. The apparatus of claim 1, wherein the instructions are further executable by the at least one processor to cause the apparatus to:
    include, associated with a quantity of codewords having the second codeword length, shortening bits in each codeword having the second codeword length and not in any codeword having the first codeword length; and
    puncture, associated with the quantity of codewords having the second codeword length, a portion of each codeword having the second codeword length but not any codewords having the first codeword length.

4. The apparatus of claim 1, wherein the instructions are further executable by the at least one processor to cause the apparatus to:
    include, associated with a quantity of codewords forming the plurality of symbols, a first quantity of shortening bits in each codeword having the first codeword length and a second quantity of shortening bits in each codeword having the second codeword length, the first quantity of shortening bits and the second quantity of shortening bits within a threshold difference of shortening bits; and puncture, associated with the quantity of codewords and the threshold difference, a portion of each codeword having the first codeword length and each codeword having the second codeword length.

5. The apparatus of claim 1, wherein the instructions are further executable by the at least one processor to cause the apparatus to:

include, associated with a quantity of codewords having the first codeword length, shortening bits in each codeword having the first codeword length but not in any codewords having the second codeword length; and puncture, associated with the quantity of codewords having the first codeword length, a portion of each codeword having the first codeword length but not any codewords having the second codeword length.

6. The apparatus of claim 1, wherein the instructions are further executable by the at least one processor to cause the apparatus to:

include, associated with a first quantity of codewords having the second codeword length, shortening bits in each codeword having the second codeword length but not any codewords having the first codeword length; and puncture, associated with a second quantity of codewords having the first codeword length, a portion of each codeword having the first codeword length but not any codewords having the second codeword length.

7. The apparatus of claim 1, wherein the instructions to perform the low-density parity check coding operation are executable by the at least one processor to cause the apparatus to:

encode a first portion of the plurality of input bits using a first code rate to generate the one or more codewords having the first codeword length; and encode a second portion of the plurality of input bits using a second code rate, that is less than the first code rate, to generate the one or more codewords having the second codeword length.

8. The apparatus of claim 1, wherein the instructions to transmit the plurality of symbols are executable by the at least one processor to cause the apparatus to transmit, without puncturing the plurality of codewords, a packet that includes the plurality of symbols and a header indicating a quantity of additional symbols, that are in addition to the plurality of symbols, in the packet.

9. The apparatus of claim 1, wherein the instructions are further executable by the at least one processor to cause the apparatus to select, associated with a quantity of the plurality of input bits satisfying a threshold, the first codeword length and the second codeword length.

10. The apparatus of claim 1, wherein the instructions are further executable by the at least one processor to cause the apparatus to calculate a quantity of coded bits to be carried in the last symbol, a quantity of assigned symbols for the plurality of symbols, and a quantity of available coded bits associated with a quantity of the plurality of input bits, a resource unit size, a modulation and coding scheme, a symbol boundary for the last symbol, or any combination thereof.

11. The apparatus of claim 10, wherein the instructions are further executable by the at least one processor to cause the apparatus to select the second codeword length, the second codeword length associated with the quantity of coded bits to be carried in the last symbol, the quantity of assigned symbols for the plurality of symbols, and the quantity of available coded bits.

12. The apparatus of claim 11, wherein the instructions are further executable by the at least one processor to cause the apparatus to select, associated with a difference between the quantity of available coded bits and the second codeword length, the first codeword length.

13. The apparatus of claim 1, wherein the instructions are further executable by the at least one processor to cause the apparatus to select the first codeword length associated with a difference between a total quantity of coded blocks that are to be used to transmit the plurality of symbols and a sub-quantity of coded blocks that are to be transmitted in the last symbol.

14. An apparatus for wireless communications at a first wireless device, comprising:

at least one processor; and at least one memory coupled with the at least one processor and storing instructions executable by the at least one processor to cause the apparatus to:

perform a low-density parity check coding operation on a plurality of input bits, the performance of the low-density parity check coding operation on the plurality of input bits producing a plurality of output bits arranged in one or more codewords having a first codeword length and one or more codewords having a second codeword length, the first codeword length being selected in accordance with a size of a resource unit satisfying a first threshold, a modulation and coding scheme index for the low-density parity check coding operation satisfying a second threshold, a quantity of coded bits per symbol satisfying a third threshold, or any combination thereof, the first codeword length being a multiple of the second codeword length and longer than 1944 bits;

arrange the one or more codewords into a plurality of symbols including one or more padded symbols after a forward error correction; and transmit, to a second wireless device via the resource unit, the plurality of symbols with a header indicating a quantity of the one or more padded symbols.

15. The apparatus of claim 14, wherein the instructions to arrange the one or more codewords are executable by the at least one processor to cause the apparatus to:

add a first quantity of symbols to the plurality of symbols, the value of the first quantity being associated with a size of the resource unit satisfying a threshold, or add a second quantity of symbols to the plurality of symbols, the value of the second quantity being associated with the size of the resource unit failing to satisfy the threshold.

16. The apparatus of claim 14, wherein a quantity of symbols for padding the plurality of symbols is associated with a quantity of coded bits per symbol.

17. The apparatus of claim 14, wherein the codeword length is greater 1944 bits.

18. A method for wireless communications at a first wireless device, comprising:

performing a low-density parity check coding operation on a plurality of input bits, the performance of the low-density parity check coding operation on the plurality of input bits producing a plurality of output bits arranged in a plurality of codewords including one or more codewords each having a first codeword length and one or more codewords each having a second codeword length that is shorter than the first codeword length, the first codeword length being a multiple of the second codeword length and longer than 1944 bits;

arranging the plurality of codewords into a plurality of symbols such that a last symbol in time of the plurality of symbols includes at least a portion of the one or more codewords having the second codeword length and no codewords having the first codeword length; and transmitting, to a second wireless device, the plurality of symbols.

19. The method of claim 18, further comprising:

including, associated with a proportion of the first codeword length to the second codeword length, a first quantity of shortening bits in each codeword having the first codeword length and a second quantity of shortening bits in each codeword having the second codeword length, the first quantity of shortening bits being greater than the second quantity of shortening bits; and puncturing, associated with the proportion of the first codeword length to the second codeword length, a first portion of each codeword having the first codeword length and a second portion of each codeword having the second codeword length.

20. The method of claim 18, further comprising:

including, associated with a quantity of codewords having the second codeword length, shortening bits in each codeword having the second codeword length and not in any codeword having the first codeword length; and puncturing, associated with the quantity of codewords having the second codeword length, a portion of each codeword having the second codeword length but not any codewords having the first codeword length.

21. The method of claim 18, further comprising:

including, associated with a quantity of codewords forming the plurality of symbols, a first quantity of shortening bits in each codeword having the first codeword length and a second quantity of shortening bits in each codeword having the second codeword length, the first quantity of shortening bits and the second quantity of shortening bits within a threshold difference of shortening bits; and puncturing, associated with the quantity of codewords and the threshold difference, a portion of each codeword having the first codeword length and each codeword having the second codeword length.

22. The method of claim 18, further comprising:

including, associated with a quantity of codewords having the first codeword length, shortening bits in each codeword having the first codeword length but not in any codewords having the second codeword length; and puncturing, associated with the quantity of codewords having the first codeword length, a portion of each codeword having the first codeword length but not any codewords having the second codeword length.

23. The method of claim 18, further comprising:

including, associated with a first quantity of codewords having the second codeword length, shortening bits in each codeword having the second codeword length but not any codewords having the first codeword length; and puncturing, associated with a second quantity of codewords having the first codeword length, a portion of each codeword having the first codeword length but not any codewords having the second codeword length.

24. The method of claim 18, wherein performing the low-density parity check coding operation comprises:

encoding a first portion of the plurality of input bits using a first code rate to generate the one or more codewords having the first codeword length; and encoding a second portion of the plurality of input bits using a second code rate, that is less than the first code rate, to generate the one or more codewords having the second codeword length.

25. The method of claim 18, wherein transmitting the plurality of symbols comprises:

transmitting, without puncturing the plurality of codewords, a packet that includes the plurality of symbols and a header indicating a quantity of additional symbols, that are in addition to the plurality of symbols, in the packet.

26. A method for wireless communications at a first wireless device, comprising:

performing a low-density parity check coding operation on a plurality of input bits, the performance of the low-density parity check coding operation on the plurality of input bits producing a plurality of output bits arranged in one or more codewords having a first codeword length and one or more codewords having a second codeword length, the first codeword length being selected in accordance with a size of a resource unit satisfying a first threshold, a modulation and coding scheme index for the low-density parity check coding operation satisfying a second threshold, a quantity of coded bits per symbol satisfying a third threshold, or any combination thereof, the first codeword length being a multiple of the second codeword length and longer than 1944 bits;

arranging the one or more codewords into a plurality of symbols including one or more padded symbols after a forward error correction; and transmitting, to a second wireless device via the resource unit, the plurality of symbols with a header indicating a quantity of the one or more padded symbols.

27. The method of claim 26, wherein arranging the one or more codewords comprises:

adding a first quantity of symbols to the plurality of symbols, the value of the first quantity being associated with a size of the resource unit satisfying a threshold, or adding a second quantity of symbols to the plurality of symbols, the value of the second quantity being associated with the size of the resource unit failing to satisfy the threshold.

28. The method of claim 26, wherein a quantity of symbols for padding the plurality of symbols is associated with a quantity of coded bits per symbol.

* * * * *